(12) United States Patent
Uemura

(10) Patent No.: US 10,720,593 B2
(45) Date of Patent: Jul. 21, 2020

(54) DISPLAY DEVICE

(71) Applicant: Japan Display Inc., Tokyo (JP)

(72) Inventor: Tsuyoshi Uemura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/288,458

(22) Filed: Feb. 28, 2019

(65) Prior Publication Data

US 2019/0280238 A1   Sep. 12, 2019

(30) Foreign Application Priority Data

Mar. 6, 2018   (JP) .................................. 2018-039999

(51) Int. Cl.
*H01L 51/50* (2006.01)
*H01L 27/32* (2006.01)
*H01L 51/52* (2006.01)

(52) U.S. Cl.
CPC ...... *H01L 51/5056* (2013.01); *H01L 27/3211* (2013.01); *H01L 27/3246* (2013.01); *H01L 51/5072* (2013.01); *H01L 51/5092* (2013.01); *H01L 51/5096* (2013.01); *H01L 51/5209* (2013.01); *H01L 51/5221* (2013.01)

(58) Field of Classification Search
None
See application file for complete search history.

(56) References Cited

U.S. PATENT DOCUMENTS

| | | | | |
|---|---|---|---|---|
| 2003/0151360 | A1* | 8/2003 | Fukunaga | H01L 51/0097 313/506 |
| 2006/0194077 | A1* | 8/2006 | Noguchi | H01L 51/5012 428/690 |

(Continued)

FOREIGN PATENT DOCUMENTS

| | | |
|---|---|---|
| JP | 2016-085913 A | 5/2016 |
| JP | 2016-103395 A | 6/2016 |

*Primary Examiner* — Anthony Ho
*Assistant Examiner* — Kevin Quinto
(74) *Attorney, Agent, or Firm* — Michael Best & Friedrich LLP

(57) ABSTRACT

A display device including a light emitting element including a first electrode, a light emitting layer and a plurality of organic layers including a hole transport layer above the first electrode, and a second electrode above the plurality of organic layers, and an insulation layer having an opening part exposing a part of the first electrode and covering a periphery side part of the first electrode, wherein when a hole mobility of the light emitting layer is $\mu_{h1}$ and a hole mobility of the hole transport layer is $\mu_{h2}$ then $$\frac{\mu_{h2}}{\mu_{h1}} \leq 10^3$$

and when a periphery length of the part of the first electrode exposed by the opening part is L and an area of the first electrode exposed by the opening part is $S_0$ then $$\frac{L}{S_0} \geq 0.07$$

9 Claims, 27 Drawing Sheets

(56) References Cited

U.S. PATENT DOCUMENTS

| | | | |
|---|---|---|---|
| 2014/0027798 A1* | 1/2014 | Sato | H01L 33/50 |
| | | | 257/89 |
| 2016/0118449 A1 | 4/2016 | Sato et al. | |
| 2016/0155785 A1 | 6/2016 | Sato | |
| 2017/0141169 A1* | 5/2017 | Sim | H01L 51/56 |

* cited by examiner

DISPLAY DEVICE

CROSS REFERENCE TO RELATED APPLICATIONS

This application is based upon and claims the benefit of priority from the prior Japanese Patent Application No. 2018-039999, filed on Mar. 6, 2018, the entire contents of which are incorporated herein by reference.

FIELD

An embodiment of the present invention is related to a display device.

BACKGROUND

An organic EL display device (Organic Electroluminescence Display) is known as one type of display device. In the organic EL display device, an organic electroluminescence material (organic EL material) is used in a light emitting element (organic EL element) which is included in each pixel of a display part. Unlike a liquid crystal display device or the like, an organic EL display device is a so-called self-light emitting type display device which realizes display by making an organic EL material emit light.

In an organic EL display device, each light emitting element generally has an organic layer including a light emitting layer between a pixel electrode and an opposing electrode. Here, an organic EL material is used for the light emitting layer. When a potential difference of 10V or more, for example, is applied to the pixel electrode and the opposing electrode, a current flows between the pixel electrode and the opposing electrode and the organic EL material emits light. For example, the light emitting layer is selectively formed for each pixel using a vapor deposition mask. In the case when an improvement of productivity and a reduction of production costs is considered, it is desirable that layers other than the light emitting layer in the organic layer are formed in common for each pixel. However, for example, when a hole injection layer (HIL) which is one of the organic layers is used commonly between each pixel, since resistivity of the hole injection layer is low, a current also flows to pixels other than a desired pixel. This current is called a leak current, a horizontal direction leak current, or a lateral leak current (referred to as a first leak current in the present specification). When the first leak current flows, pixels other than the desired pixel emit light. As a result, in the organic EL display device, the light emitting efficiency of the display device or the light emitting element decreases. In addition, color mixture occurs in the organic EL display device. As a result, image quality of the display device sometimes decreases. In addition, when a potential difference of less than 10V, for example, about 2V is applied to the pixel electrode and the opposing electrode of the desired pixel, a leak current (also referred to as a horizontal direction leak current or lateral leak current) occurs in the vicinity of a light emitting layer (referred to as a second leak current in the present specification). Due to the second leak current, the light emitting efficiency of the display device or the light emitting element may decrease.

For example, a structure in which adjacent pixels are unintentionally controlled to emit light by a first leak current is disclosed in Japanese Laid Open Patent Publications 2016-103395 and 2016-085913.

SUMMARY

A display device related to one embodiment of the present invention includes a light emitting element including a first electrode (pixel electrode), a light emitting layer (EML) and a plurality of organic layers including a hole transport layer (HTL) above the first electrode, and a second electrode (opposing electrode) above the plurality of organic layers, and an insulation layer having an opening part exposing a part of the first electrode and covering a periphery side part of the first electrode, wherein when a hole mobility of the light emitting layer is $\mu_{h1}$ and a hole mobility of the hole transport layer is $\mu_{h2}$ then $$\frac{\mu_{h2}}{\mu_{h1}} \leq 10^3$$

and when a periphery length of the part of the first electrode exposed by the opening part is L and an area of the first electrode exposed by the opening part is $S_0$ then $$\frac{L}{S_0} \geq 0.07$$

DESCRIPTION OF EMBODIMENTS

Figure 1:
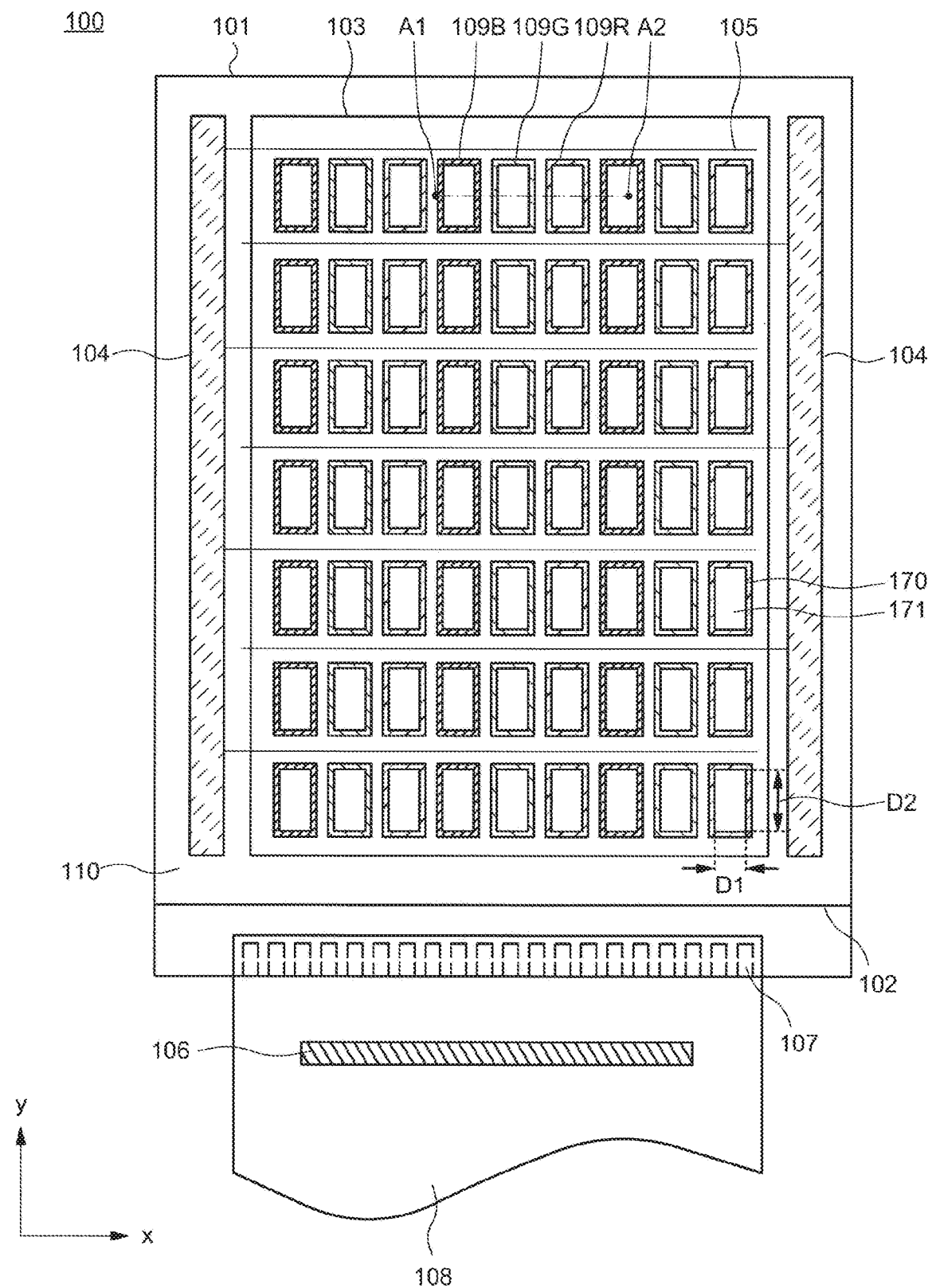
FIG. 1 is a planar diagram explaining a display device related to one embodiment of the present invention.

Each embodiment of the present invention is explained below while referring to the drawings. However, the present invention can be implemented in various modes without departing from the gist of the invention and should not to be interpreted as being limited to the description of the embodiments exemplified below. In addition, although the drawings may be schematically represented in terms of width, thickness, shape, and the like of each part as compared with their actual mode in order to make an explanation clearer, the schematic drawings are only an example and do not limit an interpretation of the present invention. Furthermore, in the present specification and each drawing, the same reference numerals are provided to elements explained in previous drawings or to the same or similar elements and a detailed explanation may be omitted accordingly.

In the present invention, when a single film is processed to form a plurality of films, these films may have different functions and roles. However, the plurality of films are derived from films formed in the same layer by the same process and have the same layer structure and the same material. Therefore, these films are defined as existing in the same layer.

Furthermore, in the present specification and the like, expressions such as "on", "above", "below" and "under" when explaining a drawing express the relative positional relationship between a structure of interest and another structure. In the present specification and the like, in a side view, a direction from an insulating surface to be described later to a bank is defined as "on" or "above", and a direction opposite thereto is defined as "under" or "below". In the present specification and the scope of the patent claims, when expressing a mode in which another structure is arranged above a certain structure, in the case where it is simply described as "above", unless otherwise noted, a case where another structure is arranged directly above a certain structure as if in contact with that structure, and a case where another structure is arranged via another structure above a certain structure, are both included.

Furthermore, ordinals such as "first", "second" and "third" in the present specification are used only for making an explanation more concise and are not to be interpreted in a limited manner.

One aim of the present invention is to control a decrease in light emitting efficiency or color mixing which occurs due to a leak current (first leak current and second leak current) to pixels other than a desired pixel in an organic EL display device and control a decrease in image quality of the organic EL display device.

1. Background of the Invention

The reduction of a leak current between adjacent pixels in an organic EL display device has been studied. The organic EL display device has a light emitting element. The light emitting element has a pixel electrode (first electrode), a plurality of organic layers stacked above the pixel electrode, and an opposing electrode (second electrode) stacked above the plurality of organic layers. For example, the pixel electrode is electrically connected to an anode and the opposing electrode is electrically connected to a cathode. The plurality of organic layers include a light emitting layer, an electron blocking layer and a hole transport layer. In addition, although explained in detail in FIG. 29 to FIG. 32, the organic EL display device has a first insulating layer which covers a periphery part of the pixel electrode and includes an opening part which exposes a part of the pixel electrode. A part of the pixel electrode which is exposed by the opening part is also a part where the pixel electrode contacts with the layer closest to the pixel electrode among the plurality of organic layers. Furthermore, although explained in detail in FIG. 1 to FIG. 14, in the process of examining reducing a leak current between adjacent pixels, it was understood that the spreading of holes in a lateral direction between the hole transporting layer and the electron blocking layer or the light emitting layer affects the characteristics of an element. In addition, when the ratio between the hole mobility of the light emitting layer or the electron blocking layer and the hole mobility of the hole transport layer is $10^3$ or less, and the ratio between the periphery length of a part of the pixel electrode which exposed by the opening part and the area of the part of the pixel electrode which is exposed by the opening part is 0.07 or more, it was understood that the first leak current which is related to the resistivity of the hole injection layer and causes pixels other than a desired pixel to emit light, can be suppressed. In addition, it was also understood that under similar conditions, it is possible to suppress the second leak current which is related to the resistivity of the hole injection layer and which occurs in the vicinity of a light emitting layer which causes a decrease in the light emitting efficiency of a light emitting element.

2. First Embodiment

In the present embodiment, a display device according to one embodiment of the present invention is explained while referring to FIG. 1 to FIG. 14.

2-1. Display Device Structure

Figure 2:
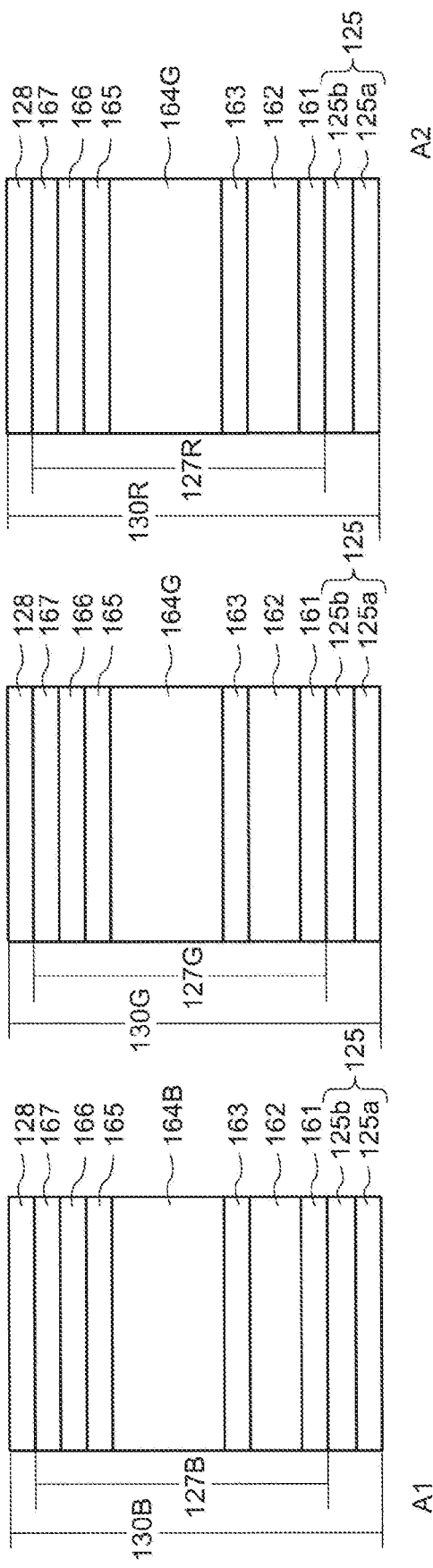
FIG. 2 is a cross-sectional diagram explaining a display device related to one embodiment of the present invention.

A structure of a display device according to one embodiment of the present invention is explained while referring to FIG. 1 and FIG. 2.

FIG. 1 is a schematic diagram showing a structure of a display device 100 according to one embodiment of the present invention. In addition, a schematic structure in the case when the display device 100 is viewed in planar view is shown in FIG. 1. In the present specification and the like, a state in which the display device 100 is viewed from a perpendicular direction to the screen (display part) is called a "planar view".

The display device 100 includes a display part 103 formed above an insulating surface, a scanning signal line drive circuit 104, and a driver IC 106. In addition, an opposing substrate 102 is arranged above the display part 103 and the scanning signal line drive circuit 104. A plurality of scanning signal lines 105 are connected to the scanning signal line drive circuit 104. The plurality of scanning signal lines 105 are arranged in an x direction of the display device 100. The driver IC 106 functions as a control part which provides a signal to the scanning signal line drive circuit 104. The driver IC 106 is incorporated with a video signal line drive circuit. Furthermore, although not shown in the diagram, a plurality of video signal lines are connected to the driver IC 106. The plurality of video signal lines are arranged in a y direction intersecting the x direction. In addition, although the driver IC 106 is arranged above a flexible printed substrate 108 by a COF (Chip on Film) method, the driver IC 106 may also be arranged above the first substrate 101. The flexible printed substrate 108 is connected to terminals 107 which are arranged in a periphery region 110.

Here, the insulating surface is the surface of the first substrate 101. The first substrate 101 supports each layer which forms a transistor and a light emitting element and the like which are arranged above the surface of the first substrate 101. For example, a glass substrate and a semiconductor substrate or the like can be used as the first substrate 101. In addition, a foldable substrate may also be used as the first substrate 101. For example, an organic resin material such as polyimide, acrylic, epoxy and polyethylene terephthalate or the like can be used as the foldable substrate. In addition, a material which transmits light or a material which does not transmit light may be used as the first substrate 101. In addition, the same substrate as the first substrate 101 can be used for the opposing substrate 102.

In the display part 103, a plurality of pixels are arranged in a matrix shape along directions which mutually intersect each other (for example, x direction and y direction which mutually intersect each other). Each of the plurality of pixels has any one of a light emitting element which emits light of a first color, a light emitting element which emits light of a second color, and a light emitting element which emits light of a third color. In the present specification and the like, in the case where the display device 100 includes R (red), G (green), and B (blue) light emitting elements, one pixel refers to a region which includes a light emitting element which emits light of one of the three colors. Furthermore, the color which is emitted by a light emitting element is not limited to three colors and may be four or more colors. In FIG. 1, the case of a stripe arrangement is explained in which each of a plurality of red pixels 109R (pixels 109R), a plurality of green pixels 109G (pixels 109G), and a plurality of blue pixels 109B (pixels 109B) are arranged along one direction (y direction) of the display part 103.

Each of the pixel 109R, pixel 109G and pixel 109B includes a pixel electrode described later and a light emitting element. The light emitting element is comprised from a part (anode) of the pixel electrode, an organic layer including a light emitting layer stacked above the pixel electrode, and a cathode. In FIG. 1, a part which exposes the pixel electrode of each of the pixels 109R, 109G and 109 is the opening part 170. As is described in detail later, the opening part 170 of the first insulating layer 126 covers the periphery part of the pixel electrode and exposes the pixel electrode. In addition, a part 171 of the pixel electrode exposed by the opening part 170 is the part where the organic layer and the pixel electrode are in contact. Although FIG. 1 shows an example in which the area of the opening part 170 of each pixel is substantially the same, the area of the opening part 170 of each pixel may also be different for each color. In addition, although FIG. 1 shows an example in which the shape of a part 171 of the pixel electrode which is exposed by the opening part 170 is a rectangular shape, this shape may also be circular or polygonal as is described later.

A data signal which corresponds to image data is provided from an image signal line drive circuit incorporated into the driver IC 106 to each of the pixels 109R, 109G and 109B. For example, a transistor which is electrically connected to a pixel electrode arranged in the pixel 109R is driven according to a data signal corresponding to image data and thereby an image corresponding to the image data is displayed on the pixel 109R. Similar to the pixel 109R, the pixels 109G and 109B are also drive whereby it is possible for the display device 100 to display an image corresponding to the image data. Here, for example, a thin film transistor (TFT) can be used as the transistor. Furthermore, an element which displays an image corresponding to the image data on a pixel is not limited to a transistor and any element may be used as long as it is an element which is equipped with a current control function.

FIG. 2 is a schematic diagram of a cross-section along the line A1-A2 of the display device shown in FIG. 1. Specifically, FIG. 2 shows a cross-section of a light emitting element in each pixel 109R, pixel 109G and pixel 109B. The pixel 109R includes a light emitting element 130R. The pixel 109G includes a light emitting element 130G. The pixel 109B includes a light emitting element 130B. In addition, the light emitting element 130R includes an organic layer 127R. The light emitting element 130G includes an organic layer 127G. The light emitting element 130B includes an organic layer 127B.

The structure of the light emitting element 130R, light emitting element 130G, and the light emitting element 130B is explained in detail. A pixel electrode 125 is arranged in each of the pixel 109R, the pixel 109G and the pixel 109B. That is, the pixel electrode 125 is arranged for each pixel. In FIG. 2, an example is shown in which the pixel electrode 125 is stacked with a pixel electrode 125b which is formed from a conductive material having transparency and a pixel electrode 125a which is formed from a reflective conductive material. The pixel electrode 125 may also be formed from either a pixel electrode 125b which is formed from a conductive material having transparency or a pixel electrode 125a which is formed from a conductive material having reflectivity. By providing the pixel electrode 125 with a structure in which a conductive material having reflectivity and a conductive material having transparency are stacked, it is possible to provide a light emitting element with a microcavity structure which utilizes a resonance effect of light. By providing the light emitting element with a microcavity structure, it is possible to match the EL spectrum peak wavelength of each color of red, green, and blue with the optical path length between a pixel electrode and an opposing electrode, and extract the strongest light of each color.

A hole injection layer 161 is arranged above the pixel electrode 125. The hole injection layer 161 is arranged in common for the pixels 109R, 109G and 109B.

A hole transport layer 162 is arranged above the hole injection layer 161. The hole transport layer 162 is arranged in common for the pixels 109R, 109G and 109B.

An electron blocking layer 163 is arranged above the hole transport layer 162. The electron blocking layer 163 is arranged in common for the pixels 109R, 109G and 109B.

A light emitting layer 164R, a light emitting layer 164G and a light emitting layer 164B are arranged above the electron blocking layer 163. The light emitting layer 164R is arranged in the pixel 109R. The light emitting layer 164G is arranged in the pixel 109G. The light emitting layer 164B is arranged in the pixel 109B. Each of the light emitting layer 164R, the light-emitting layer 164G and the light emitting layer 164B is formed by a mixed material (mixed host) of an electron transporting material (electron transporting host) and a hole transporting material (hole transporting host).

A hole blocking layer 165 is arranged in common above the light emitting layer 164R, the light emitting layer 164G and the light emitting layer 164B. An electron transport layer 166 is arranged above the hole blocking layer 165. An electron injection layer 167 is arranged above the electron transport layer 166. That is, the hole blocking layer 165, the electron transport layer 166 and the electron injection layer 167 are arranged in common for the pixels 109R, 109G and 109B.

An opposing electrode 128 is arranged above the electron injection layer 167. The opposing electrode 128 is arranged in common for the pixels 109R, 109G and 109B. The opposing electrode 128 is formed from a conductive material having transparency.

As explained above, the organic layer 127R includes the hole injection layer (HIL) 161, the hole transport layer 162, the electron blocking layer (EBL) 163, the light emitting layer 164R, the hole blocking layer (HBL) 165, the electron transport layer (ETL) 166 and the electron injection layer (EIL) 167. The organic layer 127G includes the hole injection layer 161, the hole transport layer 162, the electron blocking layer 163, the light emitting layer 164G, the hole blocking layer 165, the electron transport layer 166 and the electron injection layer 167. The organic layer 127B includes the hole injection layer 161, the hole transport layer 162, the electron blocking layer 163, the light emitting layer 164B, the hole blocking layer 165, the electron transport layer 166 and the electron injection layer 167. By stacking from the pixel electrode 125 to the opposing electrode 128, it is possible to form each of the light emitting element 130R, the light emitting element 130G and the light emitting element 130B respectively.

In the present specification, the light emitting element 130R may be called a first light emitting element. The light emitting element 130G may be called a second light emitting element. The light emitting element 130B may be called a third light emitting element.

In FIG. 2, the layer which is closest to the pixel electrode 125 among the plurality of organic layers is the hole injection layer 161. Therefore, a part 171 of the pixel electrode which is exposed by the opening part 170 (shown in FIG. 1) contacts with the hole injection layer 161. Furthermore, among the plurality of organic layers, the layer which is in contact with the pixel electrode 125 is not limited to the hole injection layer 161. The layer which is in contact with the pixel electrode 125 among the plurality of organic layers may also be the hole transport layer 162. As long as the pixel electrode and the plurality of organic layers are appropriately examined without departing from one embodiment of the present invention, a layer which is in contact with a part 171 of the pixel electrode which is exposed by the opening part 170 (shown in FIG. 1) among the plurality of organic layers may be determined.

2-2. First Leak Current and Second Leak Current

Figure 3:
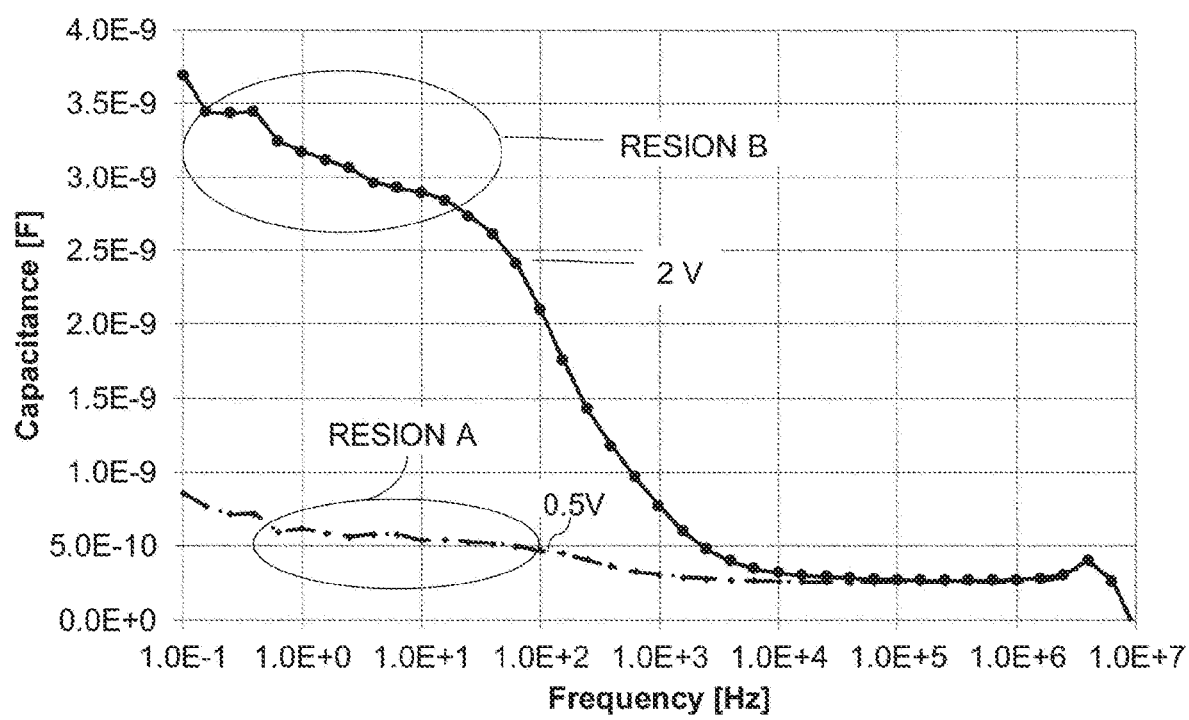
FIG. 3 is a diagram for explaining a lateral leak current of a display device related to one embodiment of the present invention.
Figure 4:
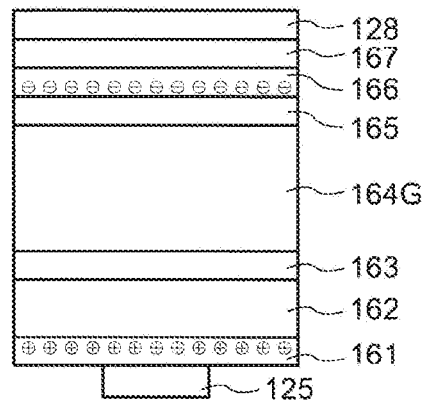
FIG. 4 is a diagram for explaining a lateral leak current of a display device related to one embodiment of the present invention.
Figure 5:
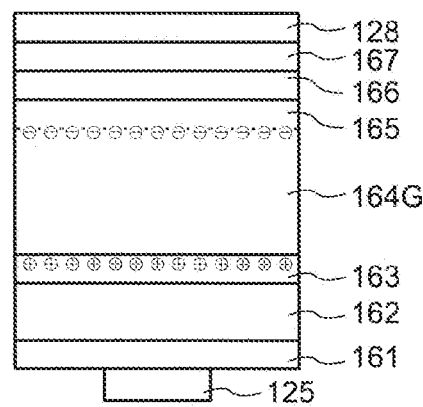
FIG. 5 is a diagram for explaining a lateral leak current of a display device related to one embodiment of the present invention.

In the display device according to one embodiment of the present invention, the first leak current and the second leak current are explained while referring to FIG. 3 to FIG. 5.

FIG. 3 is a plot of capacitance with respect to frequency when performing an analysis (IS analysis) using impedance spectroscopy in the light emitting element 130G according to one embodiment of the present invention. The stacked structure shown in FIG. 4 and FIG. 5 is similar to the cross section of the pixel 109G shown in FIG. 2. An explanation similar to FIG. 2 is omitted here. FIG. 4 shows a state of the light emitting element 130G in a region A shown in FIG. 3. FIG. 5 shows a state of the light emitting element 130G in a region B shown in FIG. 3. Furthermore, the IS analysis is one method for analyzing a stacked structure such as a light emitting element for example. Since the IS analysis is a general method for analyzing a stacked structure, an explanation is omitted here.

The capacitance in FIG. 3 is the capacitance of the organic layer 127G between the opposing electrode 128 and the pixel electrode 125. Specifically, the two plots shown in FIG. 3 show capacitances with respect to frequency when a voltage applied between the opposing electrode 128 and the pixel electrode 125 is 0.5V and 2V.

Here, the region A in FIG. 3 and FIG. 4 are referred to. When the voltage which is applied between an opposing electrode 128 and the pixel electrode 125 is 0.5V, the capacitance increases slightly as the frequency decreases. This suggests that holes which are injected from the hole injection layer 161 into the hole transport layer 162 spread in a lateral direction. That is, this suggests that "lateral direction leak" in which a current leaks in a lateral direction occurs. This is the first leak current. It is considered that the reason why the first leak current occurs is because resistivity of the hole injection layer 161 is low. When the first leak current flows, pixels other than a desired pixel emit light. As a result, in the organic EL display device, the light emitting efficiency of the display device or the light emitting element decreases. In addition, color mixture occurs in the organic EL display device. As a result, image quality of the display device decreases.

Next, the region B in FIG. 3 and FIG. 5 are referred to. When the voltage which is applied between the opposing electrode 128 and the pixel electrode 125 is 2V, the capacitance increases as the frequency decreases. In particular, although the change in capacitance is small at a frequency of 10 Hz to 1 Hz, when the frequency is 1 Hz or less, the capacitance increases rapidly. This suggests that holes and electrons in the vicinity of the light emitting layer 164G stagnate. In other words, this means that the larger the proportion of the electron transporting host among mixed hosts which form the light emitting layer 164G, the more holes and electrons easily stagnate between the light emitting layer 164G or the electron blocking layer 163 and the hole transporting layer 162, for example at the interface between the light emitting layer 164G or the electron blocking layer 163 and the hole transport layer 162. That is, this suggests that a "lateral leak" in which a current leaks in a lateral direction occurs due to stagnating holes or the like. This is the second leak current. It is considered that the reason why the second leak current occurs is due to the difference between a hole mobility μh1 of the light emitting layer 164G or the electron blocking layer 163 and a hole mobility μh2 of the hole transport layer 162. Due to the second leak current, the light emitting efficiency of the display device or the light emitting element decreases. Furthermore, although the electron blocking layer 163 is in direct contact with the light emitting layer 164G, since the film thickness of the electron blocking layer is thin, holes in the hole transport layer 162 are considered to be the main cause of the second leak current.

It can be understood from FIG. 3 to FIG. 5 that spreading of holes between the hole transporting layer and the electron blocking layer or the light emitting layer in a lateral direction, that is, the first leak current and the second leak current which are "lateral direction leaks" affects the characteristics of an element. Therefore, it is possible to suppress the first leak current and the second leak current by defining the ratio of the hole mobility between the hole transporting layer and the electron blocking layer or the light emitting layer.

2-3. Ratio of Light Emitting Efficiency, Current Density and Hole Mobility

The ratio of light emitting efficiency, current density and hole mobility in the display device according to one embodiment of the present invention is explained while referring to FIG. 6 to FIG. 10.

Figure 6:
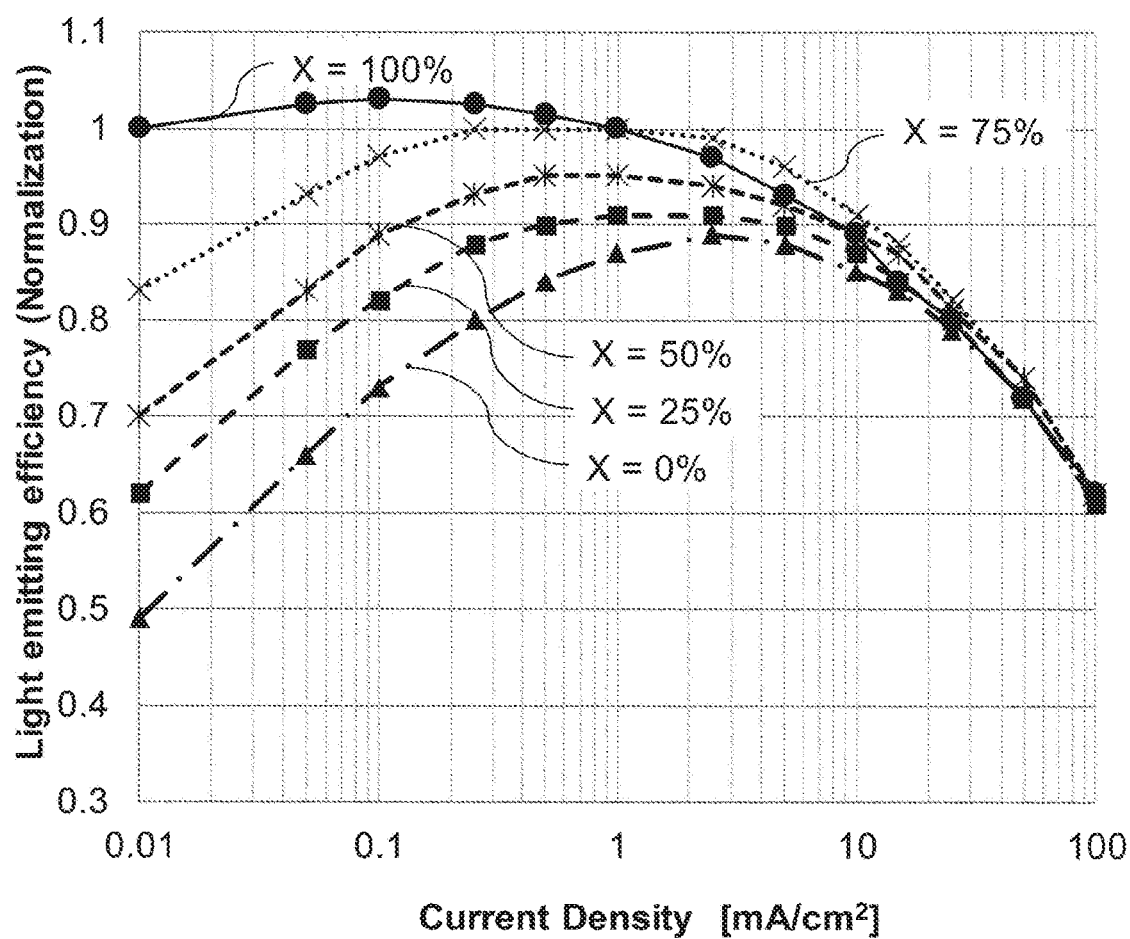
FIG. 6 is a diagram showing light emitting efficiency with respect to current density of a display device related to one embodiment of the present invention.

FIG. 6 shows light emitting efficiency with respect to current density in the light emitting element 130G. A value of X shows the part of an electron transporting host which forms the light emitting layer 164G included in the light emitting element 130G. Therefore, X-100 is the part of the hole transporting host which forms the light emitting layer 164G included in the light emitting element 130G. For example, in FIG. 3, the dotted line X=75% shows that the light emitting layer 164G is formed by a mixed host having 75% of an electron transporting host and 25% of a hole transporting host. For example, in the light emitting layer 164G, in order to achieve a current density of 0.01 mA/cm$^2$ and a light emitting efficiency of 80% or more, it is necessary that the light emitting layer 164G contains 75% or more of the electron transporting host. Furthermore, in FIG. 6, lines such as the solid X=100% and the dotted line X=75% are lines calculated by a calculation. Each point is an actually measured value measured under the conditions indicated by each line. FIG. 6 shows that the measured value and the calculated value are relatively correct.

Figure 7:
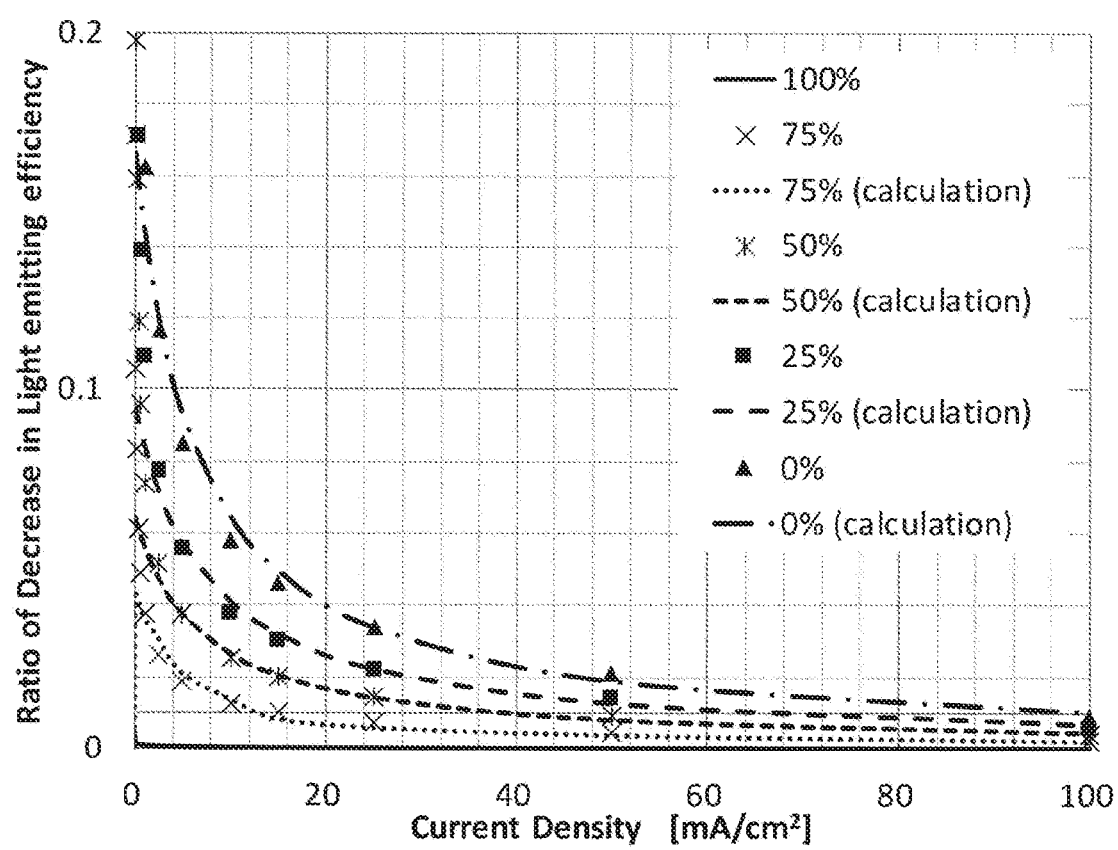
FIG. 7 is a diagram showing a light emitting efficiency reduction ratio with respect to current density of a display device related to one embodiment of the present invention.

FIG. 7 shows the ratio of a decrease in light emitting efficiency with respect to current density in the light emitting element 130G. FIG. 7 is a diagram in which the light emitting efficiency on the vertical axis in FIG. 6 is converted into a decrease in light emitting efficiency by subtracting the value on the vertical axis in FIG. 6 from 1. Furthermore, the horizontal axis of FIG. 7 is obtained by converting the horizontal axis in FIG. 6 from a logarithmic display to a linear display. In addition, 100%, 75%, 50%, 25% and 0% in FIG. 7 are the same as the ratio X of the electron transporting host in FIG. 6. Furthermore, also in FIG. 7, lines such as the solid line X=100% and the dotted line X=75% are lines calculated by calculation the same as in FIG. 6. Each point is an actually measured value measured under the condition shown by each line.

Figure 8:
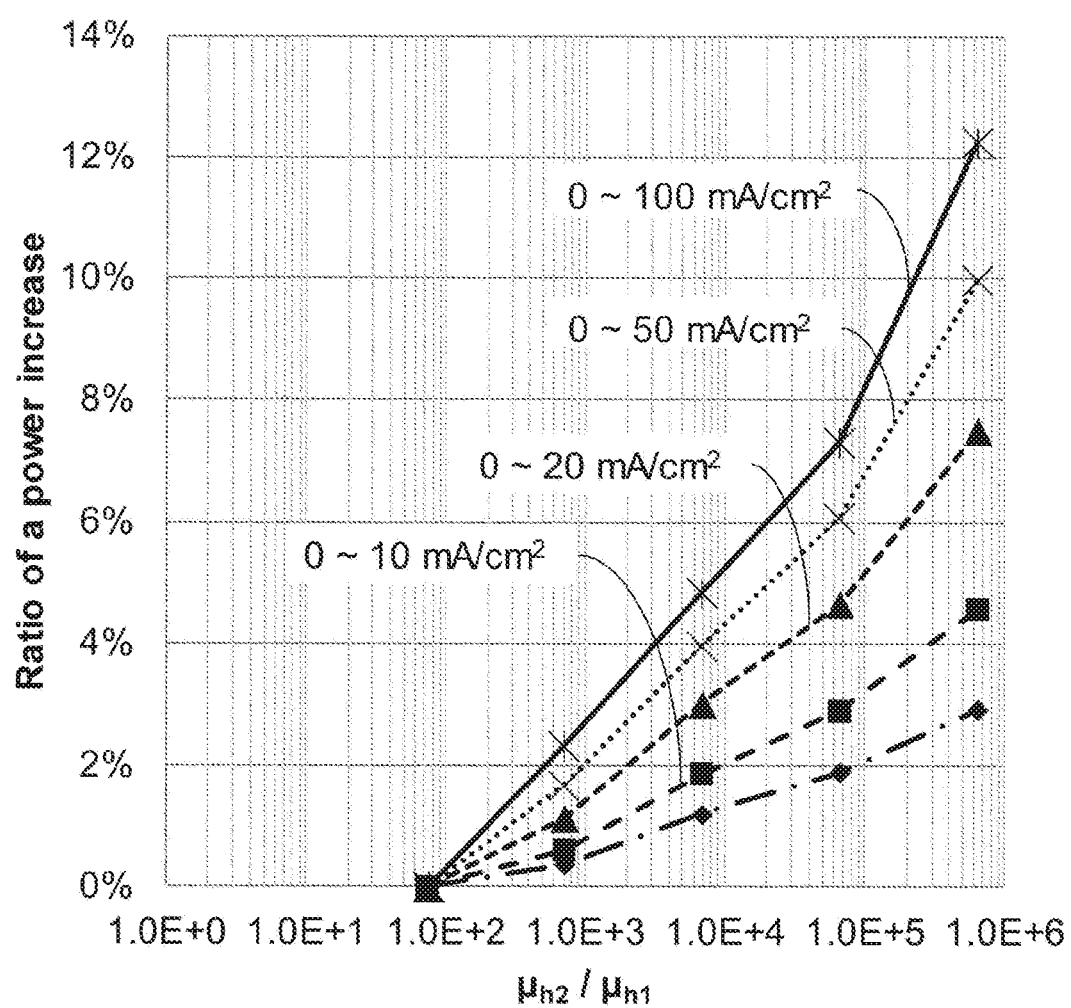
FIG. 8 is a diagram showing a light emitting efficiency increase ratio with respect to a hole mobility ratio of a display device related to one embodiment of the present invention.

FIG. 8 shows the ratio of a power increase with respect to the ratio of hole mobility (hole mobility μh$_2$ of a hole transport layer/hole mobility μh$_1$ of a light emitting layer or electron blocking layer). The vertical axis in FIG. 8 is a value obtained by replacing a value integrated in an arbitrary current density range in FIG. 6 with the value of a power increase. That is, the vertical axis in FIG. 8 is a value obtained by replacing the amount of decrease in light emitting efficiency in the current density range with the value of the power increase. In FIG. 8, values integrated within each current density range of 0 to 10 mA/cm$^2$, current density 0 to 20 mA/cm$^2$, current density 0 to 50 mA/cm$^2$ and a current density 0 to 100 mA/cm$^2$ are replaced with a value of a power increase. Here, in the display device, in general, when the light emitting efficiency of the display device or the light emitting element decreases, the power necessary for causing a predetermined luminosity to be emitted increases.

According to FIG. 8, in the case when the ratio of the hole mobility is larger than 10$^3$, the slope of the graph in each current density range is steep. That is, when the ratio of the hole mobility is larger than 10$^3$, it is understood that power increases rapidly.

Figure 9:
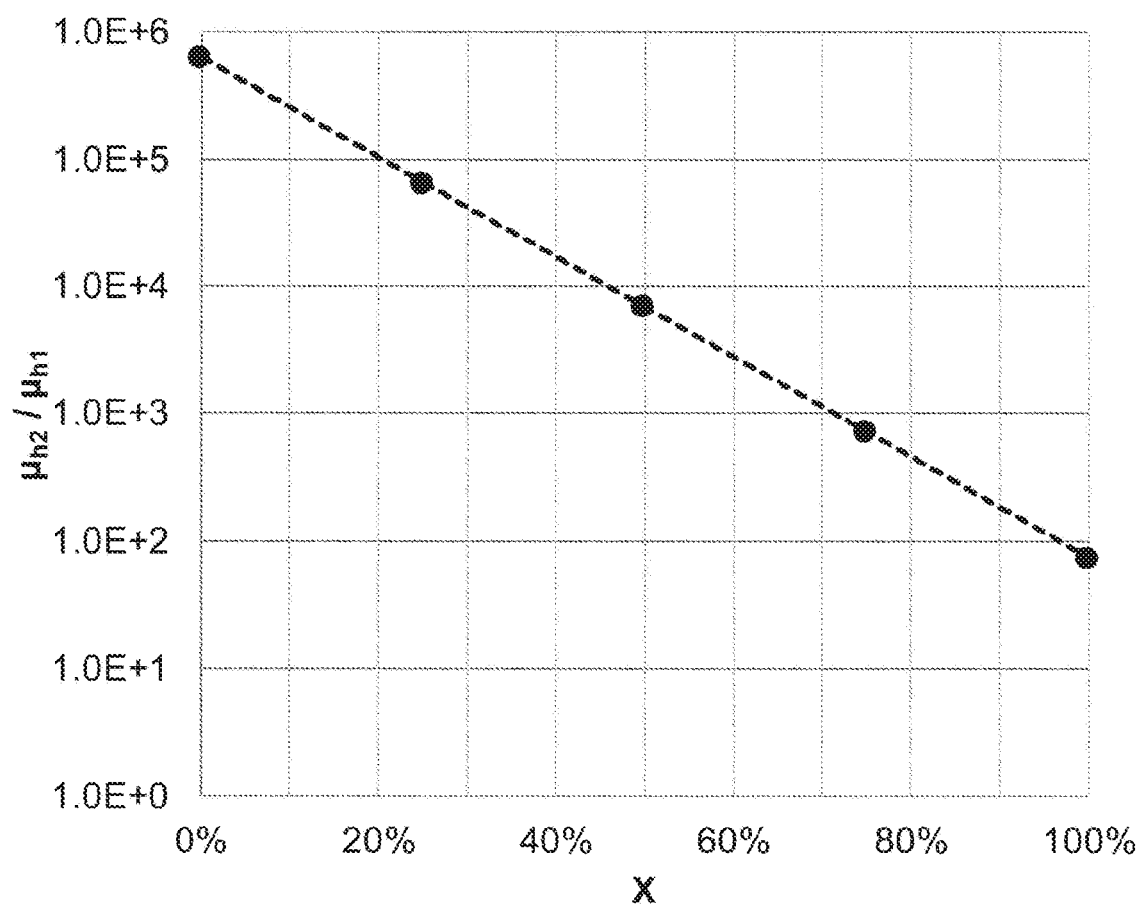
FIG. 9 is a diagram showing a hole mobility ratio with respect to a hole transportation host ratio of a display device related to one embodiment of the present invention.

FIG. 9 shows the ratio of hole mobility with respect to the ratio X of the electron transporting host. According to FIG. 9, when the ratio of the hole mobility is 10$^3$, the ratio X of the electron transporting host is 75%.

Figure 10:
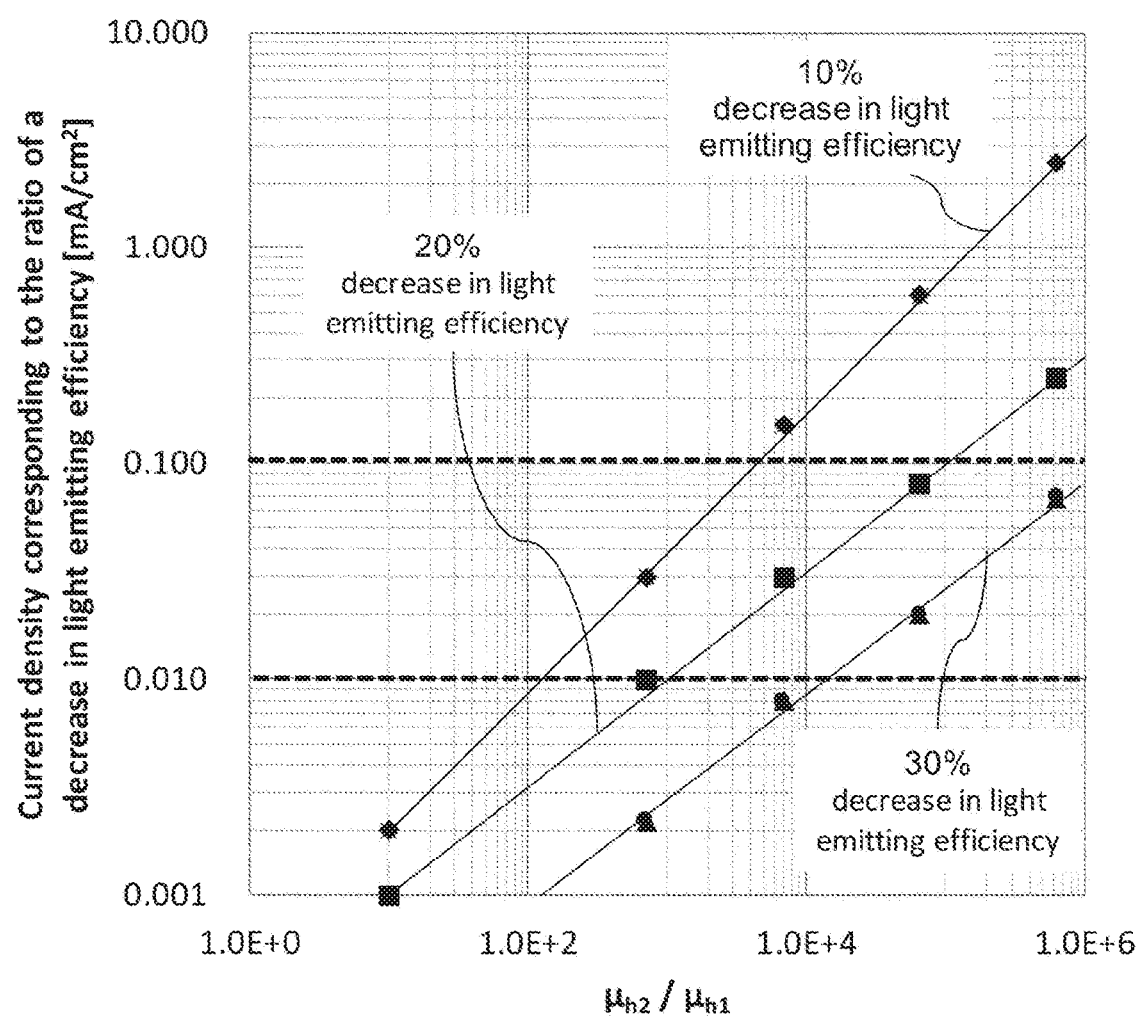
FIG. 10 is a diagram showing a current density with respect to light emitting efficiency decrease ratio with respect to a hole mobility ratio of a display device related to one embodiment of the present invention.

FIG. 10 shows current density corresponding to the ratio of a decrease in light emitting efficiency with respect to the ratio of hole mobility. According to FIG. 10, it is understood that when the ratio of hole mobility is 10$^3$ and current density is 0.01 mA/cm$^2$, the decrease in the light emitting efficiency is 20%.

As is shown in FIG. 6 to FIG. 10, a rapid increase in power occurs in the case when the ratio of hole mobility is larger than $10^3$. When the ratio of hole mobility is $10^3$, the decrease in light emitting efficiency is 20%. Therefore, when the ratio of the hole mobility is equal to or less than $10^3$ (Formula (1)), that is, when the decrease in light emitting efficiency is 20% or less, it is possible to suppress the increase in power of the light emitting element. As a result, it is also possible to suppress an increase in power of the display device. Furthermore, when the ratio of the hole mobility is equal to or less than $10^3$ and the decrease in light emitting efficiency is 20% or less, the current density is 0.01 mA/cm$^2$, the ratio X of the electron transporting host is 75%, and the ratio 100-X of the hole transport host is 25%.

$$\frac{\mu_{h2}}{\mu_{h1}} \leq 10^3 \quad (1)$$

In addition, when FIG. 6 to FIG. 10 are referred to, especially FIG. 10, when current density of the light emitting element is 0.1 mA/cm$^2$ in the display device and a decrease in light emitting efficiency is permitted up to 20%, then the ratio of the hole mobility may be $10^5$ or less. At this time, the ratio X of the electron transport host is 25%, and the ratio of the hole transport host 100-X is 75%. Since the current density of the light emitting element is 0.1 mA/cm$^2$ and the ratio of the hole mobility is $10^5$ or less, that is, a decrease in light emitting efficiency is 20% or less, it is possible to suppress an increase in power of the light emitting element.

2-4. Area of a Part of a Pixel Electrode Exposed by an Opening Part and Periphery Length of a Part of a Pixel Electrode Exposed by the Opening Part The area of a part of the pixel electrode exposed by the opening part and the periphery length of a part of the pixel electrode exposed by the opening part in the display device according to one embodiment of the present invention are explained while referring to FIG. 11 to FIG. 14.

Figure 11:
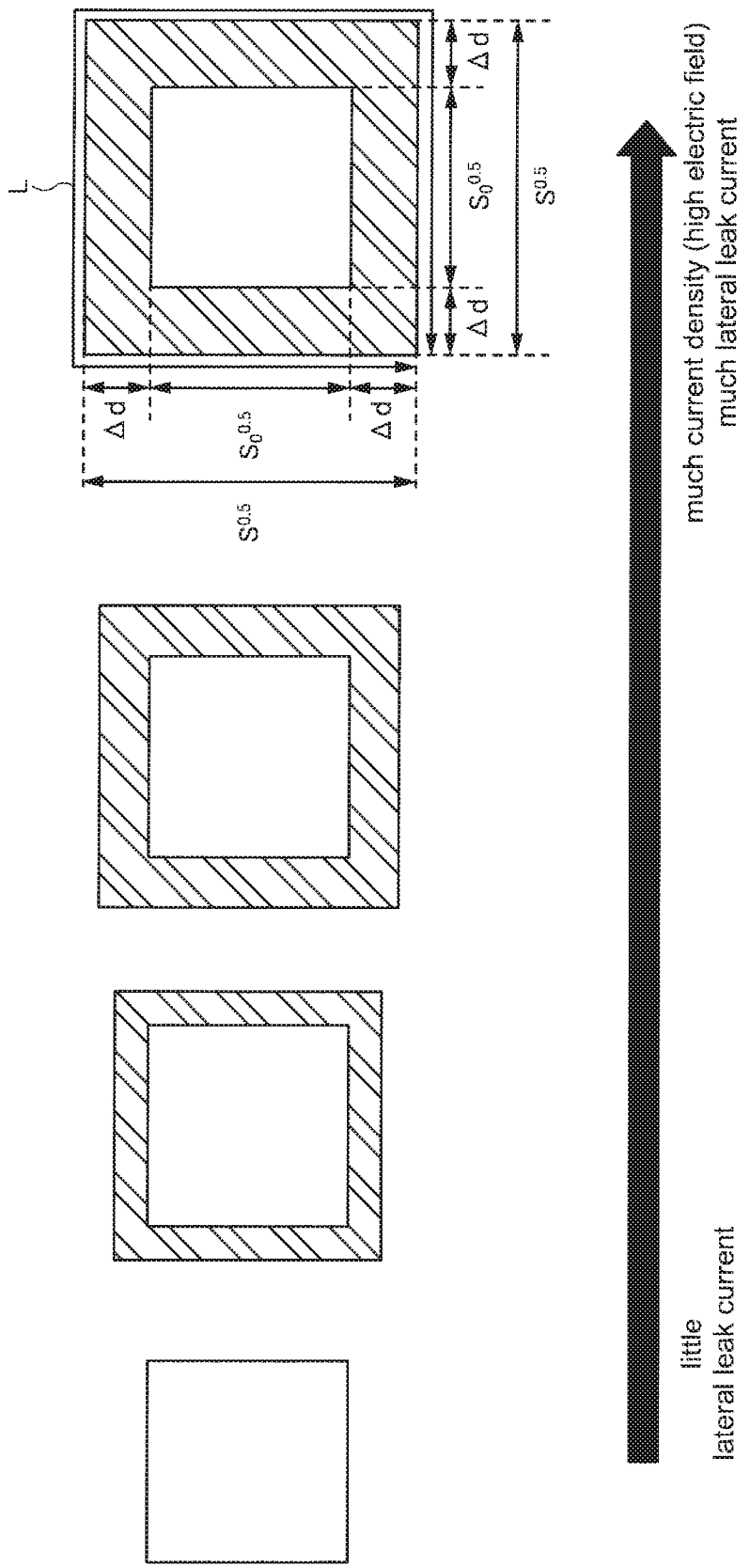
FIG. 11 is diagram for explaining the area of a part of a pixel electrode exposed by an opening part and the area of a lateral leak current of a display device related to one embodiment of the present invention.

FIG. 11 shows the area of a part of the pixel electrode which is exposed by the opening part of the display device according to one embodiment of the present invention and the area of a leak current.

When the area of a part of the pixel electrode which is exposed by the opening part is $S_0$, the area of a part of the pixel electrode which is exposed by the opening part including the lateral leak current is S, periphery length of a part of the pixel electrode which is exposed by the opening part is L and the width of the lateral leak current is $\Delta d$, then it is possible to express the area S of a part of the pixel electrode which is exposed by the opening part by the equation (2). Furthermore, in the present specification, the lateral leak current in the equation includes the first leak current and the second leak current. Furthermore, in the present specification and the like, it is assumed that a part of the lateral leak current $\Delta d$ does not contribute to the light emitting efficiency (a function of actual distance). In addition, the area S of the opening part including the lateral leak current was set as the area of a part of the pixel electrode which is exposed by a virtual opening part taking the lateral leak current into account. Furthermore, in order to promote understanding, the shape of a part of the pixel electrode which is exposed by the opening part is a square.

$$S = (\sqrt{S_0} + 2\Delta d)^2 = S_0 + L\Delta d \quad (2)$$

Generally, light emitting efficiency is dependent on the area where a light emitting element emits light. Therefore, a decrease in light emitting efficiency can be represented by $S_0/S$ which is the ratio of the area $S_0$ of a part of the pixel electrode which is exposed by the opening part and the area S of a part of the pixel electrode which is exposed by the opening part including the lateral leak current. From the equation 2, $S_0/S$ can be expressed by equation (3).

$$\frac{S_0}{S} = \frac{S_0}{S_0 + L\Delta d} = \frac{1}{\frac{L}{S_0} \times \Delta d + 1} \quad (3)$$

From equation 3, $S_0/S$ (the decrease $S_0/S$ of light emitting efficiency) can be expressed by $L/S_0$ (the ratio of the periphery length L of a part of the pixel electrode which is exposed by the opening part with respect to the area $S_0$ of a part of the pixel electrode which exposed by the opening part). That is, $S_0/S$ is inversely proportional to $L/S_0$. Therefore, if $S_O$ is very large, the lateral leak current has almost no effect on the decrease of light emitting efficiency. In the case when $S_0$ is small, since L cannot be ignored with respect to $S_0$, the lateral leak current greatly affects the decrease in light emitting efficiency.

Furthermore, when a voltage applied to the pixel electrode and the opposing electrode of the light emitting element is large, that is, when the electric field is high (the electric field intensity is high), the lateral leak current increases. When the voltage which is applied to the pixel electrode and the opposing electrode of the light emitting element is small or 0, that is, when the electric field is low (when the electric field strength is small), the lateral leak current decreases.

Figure 12:
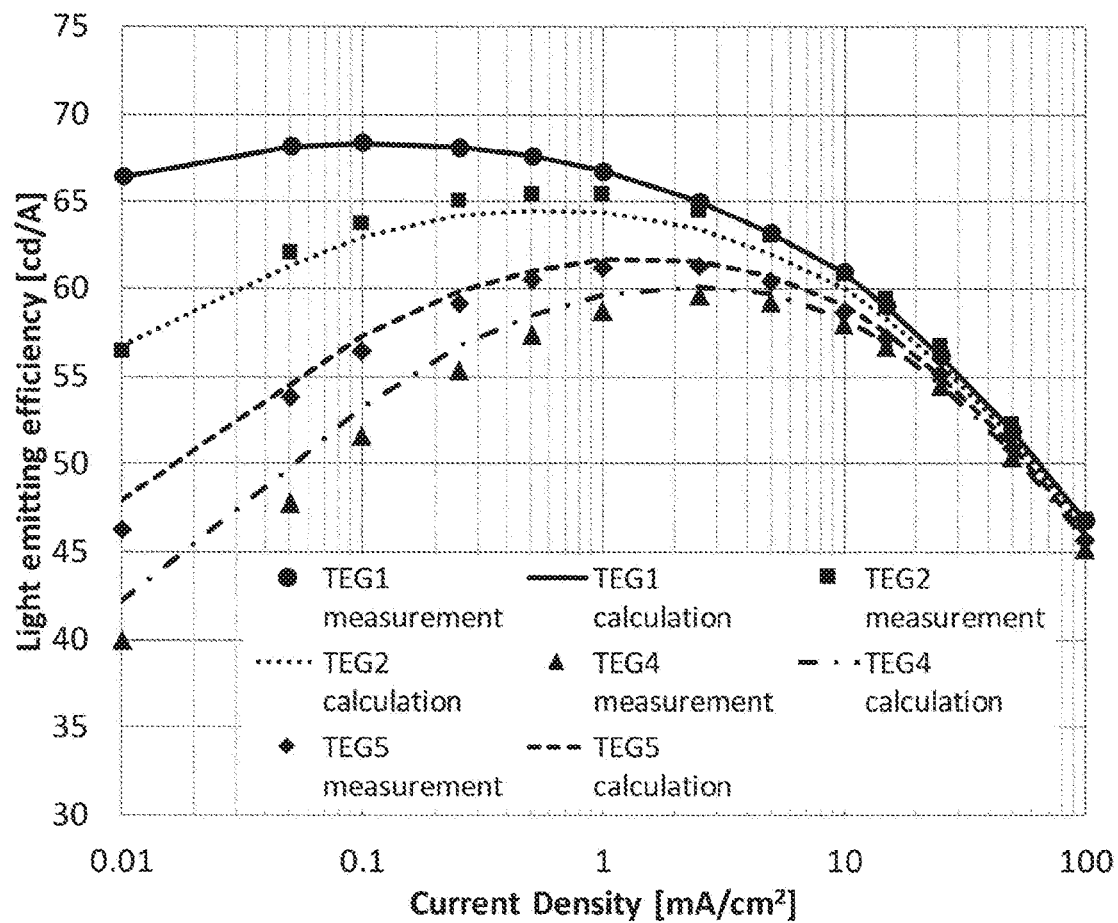
FIG. 12 is a diagram showing light emitting efficiency with respect to current density of a display device related to one embodiment of the present invention.

FIG. 12 is a diagram showing light emitting efficiency with respect to current density of the display device according to one embodiment of the present invention. In the TEG of the five kinds of light emitting elements 130G namely TEG1, TEG2, TEG4 and TEG5, the light emitting efficiency with respect to current density is shown. TEG1, TEG2, TEG4 and TEG5 are TEGs in which the area of a part of a pixel electrode which is exposed by the opening part 170 is respectively different. For example, the shape of TEG1 has an area of a part of the pixel electrode which is exposed by the opening part 170 of 2000 µm×2000 µm. In the present specification, since the area of a part of the pixel electrode which is exposed by the opening part 170 is very large, it is assumed that a lateral leak current is not generated TEG1. Therefore, it is assumed that TEG1 has a decrease in light emitting efficiency of 0%. In FIG. 12, the markers of each TEG are actually measured values.

Figure 13:
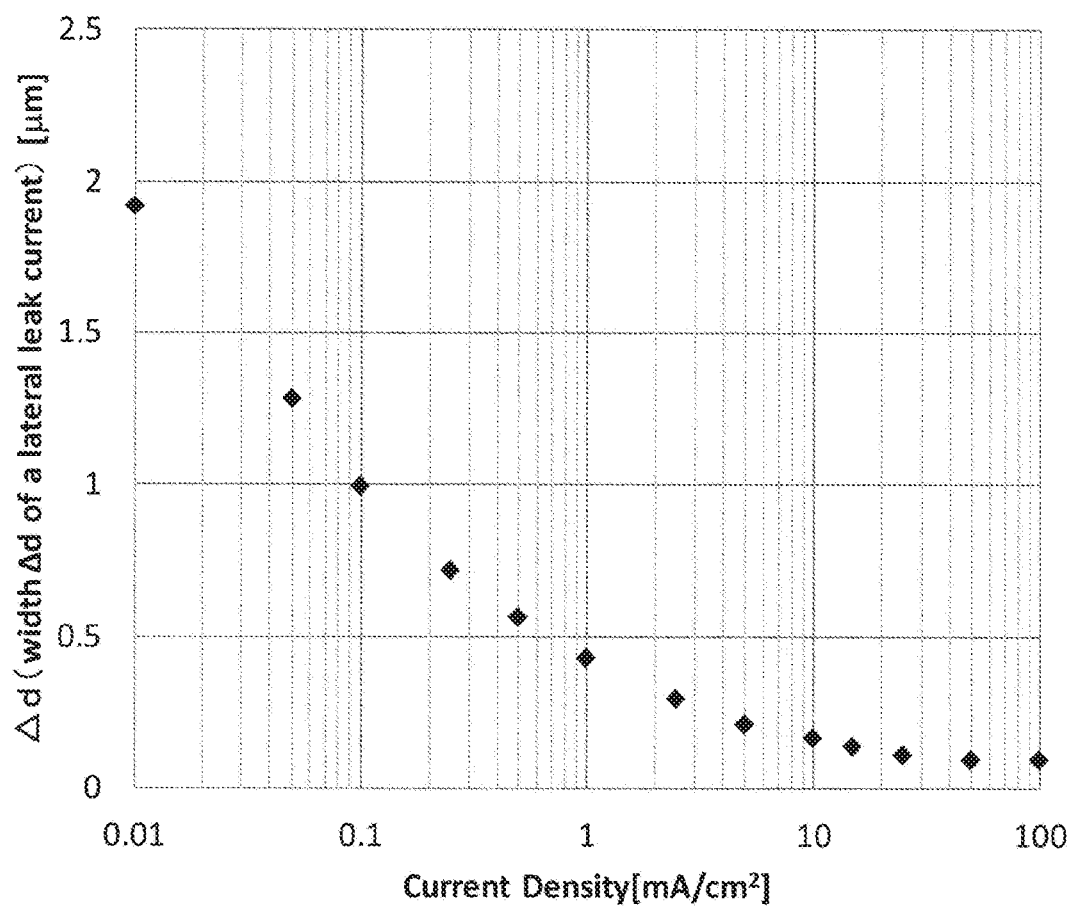
FIG. 13 is a diagram showing a length produced by a lateral leak current with respect to current density of a display device related to one embodiment of the present invention.

For example, assuming that a difference in light emitting efficiency in the same current density is $L/S_0$ in TEG1 and TEG2 for example based on the actual measured values in FIG. 12, FIG. 13 shows the results of calculating $\Delta d$ based on the equation 3 from $L/S_0$ and the area of a part of a pixel electrode which is exposed by the opening part. As a result, almost the same results are obtained also in TEG1 and TEG4, and TEG1 and TEG5. That is, FIG. 13 shows that the width $\Delta d$ of a lateral leak current is substantially the same even if the area of a part of the pixel electrode which is exposed by the opening part 170 is different when the current density is the same. From FIG. 13, for example, when the current density is 0.01 mA/cm$^2$, the width $\Delta d$ of the lateral leak current is 1.92 µm. or example, when the current density is 0.1 mA/cm$^2$, the width $\Delta d$ of the lateral leak current is 0.993 µm.

A line such as a solid line or a broken line of each TEG in FIG. 12 is based on a calculated value calculated from the width Δd of the lateral leak current with respect to each current density in FIG. 13 and from the area of a part of the pixel electrode exposed by the opening part of each TEG. According to FIG. 12, even if the shape of a part of the pixel electrode which is exposed by the opening part is different, the decrease of light emitting efficiency due to the effect of the lateral leak current almost matches with the calculation. Therefore, in the case when the materials for forming the light emitting element are the same, even if the shape of a part of the pixel electrode which is exposed by the opening part is different, $S_0/S$ (the decrease in light emitting efficiency) can be represented by $L/S_0$ based on equation 3.

Figure 14:
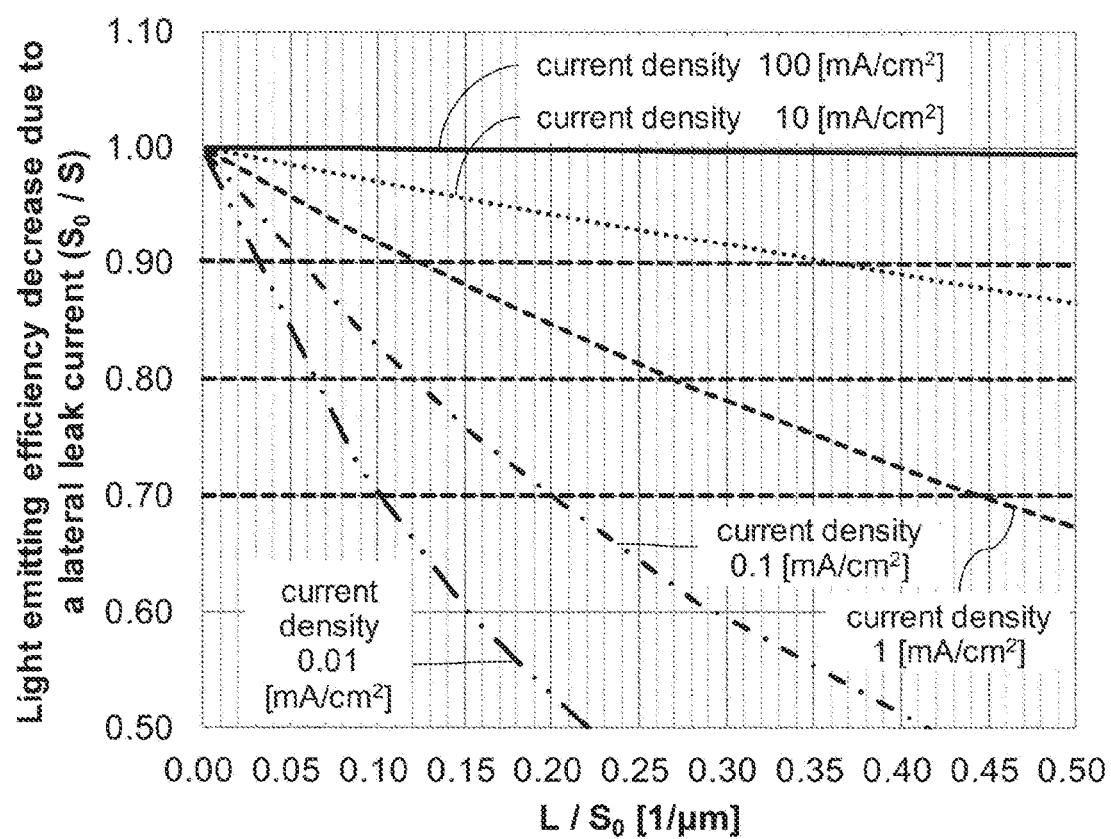
FIG. 14 is a diagram for explaining a light emitting efficiency decrease due to a lateral leak current of a display device related to one embodiment of the present invention.

FIG. 14 shows a decrease in light emitting efficiency due to a lateral leak current of a display device according to one embodiment of the present invention. As explained in FIG. 6 to FIG. 10, in order to set $S_0/S$ (the decrease in light emitting efficiency) within 20% (light emission efficiency of 80% or more) at a current density of 0.01 mA/cm², it is necessary to make $L/S_0$ smaller than 0.07. However, making $L/S_0$ smaller than 0.07 increases the area $S_0$ of a part of the pixel electrode which is exposed by the opening part. Therefore, it is preferred that $L/S_0$ is set to 0.07 or more (equation (4)) for high definition of the display device.

$$\frac{L}{S_0} \geqq 0.07 \qquad (4)$$

Furthermore, in the present embodiment, an example was explained using the light emitting element 130G and the light emitting layer 164G included in the pixel 109G. With respect to the light emitting element 130R and the light emitting layer 164R included in the pixel 109R, measurements are carried out in the same manner as the light emitting element 130G and the light emitting layer 164G included in the pixel 109G, and the measured value and the calculated value are calculated so that the light emitting element 130G can be handled in the same manner as the light emitting layer 164G. With respect to the light emitting element 130B and the light emitting layer 164B included in the pixel 109B, measurements are carried out in the same manner as the light emitting element 130G and the light emitting layer 164G of the pixel 109G, and the measured value and the calculated value are calculated so that the light emitting element 130G can be handled in the same manner as the light emitting layer 164G.

As explained above, in the display device according to one embodiment of the present invention, by setting $L/S_0$ to 0.07 or more, it is possible to make the display device high definition. In addition, in the display device according to one embodiment of the present invention, by setting the ratio of the hole mobility to $10^3$ or less, it is possible to suppress an increase in power of a light emitting element. As a result, it is possible to suppress an increase in power of the display device. Furthermore, in the display device according to one embodiment of the present invention, by setting the ratio of the hole mobility to $10^3$ or less, it is possible to suppress both a lateral leak current (first leak current) generated in a hole transport layer and a lateral leak current (second leak current) generated in a light emitting layer or an electron blocking layer and hole transport layer. The display device according to one embodiment of the present invention can suppress mixed color emitted by pixels other than a desired pixel and can also suppress a decrease in light emitting efficiency.

3. Second Embodiment

In the embodiment, an example in which the shape of a part of the pixel electrode which is exposed by the opening part is different from the first embodiment is explained while referring to FIG. 15(A) to FIG. 15(F). The explanation of the background of the invention and the structure similar to that of the first embodiment may be omitted.

Figure 15A:
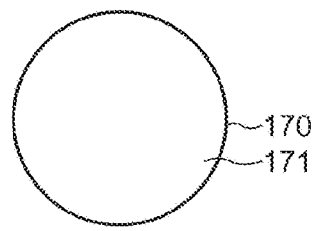
FIG. 15(A) is an example in which the shape of a part of a pixel electrode exposed by an opening part is a circle in a display device related to one embodiment of the present invention.
Figure 15B:
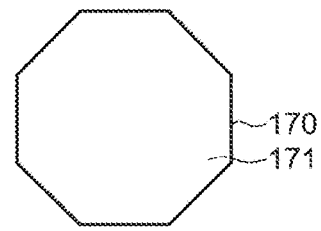
FIG. 15(B) is an example in which the shape of a part of a pixel electrode exposed by an opening part is an octagon in a display device related to one embodiment of the present invention.
Figure 15C:
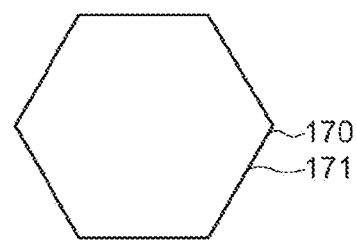
FIG. 15(C) is an example in which the shape of a part of a pixel electrode exposed by an opening part is a hexagon in a display device related to one embodiment of the present invention.
Figure 15D:
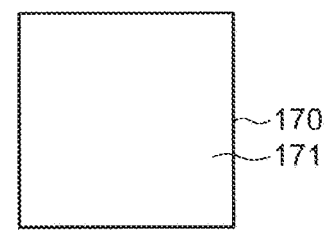
FIG. 15(D) is an example in which the shape of a part of a pixel electrode exposed by an opening part is a square in a display device related to one embodiment of the present invention.
Figure 15E:
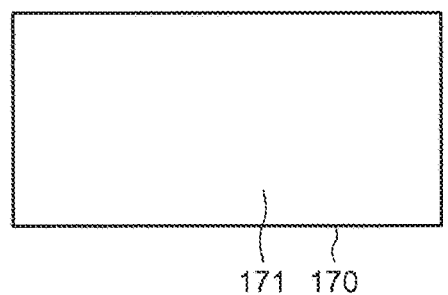
FIG. 15(E) is an example in which the shape of a part of a pixel electrode exposed by an opening part is a rectangle in a display device related to one embodiment of the present invention.
Figure 15F:
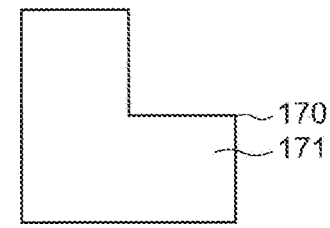
FIG. 15(F) is an example in which the shape of an opening part is an L shape in a display device related to one embodiment of the present invention.

FIG. 1 shows an example in which the shape of a part 171 of the pixel electrode which is exposed by the opening part 170 is a rectangle. The shape of the part 171 of the pixel electrode which is exposed by the opening part 170 in the present embodiment is shown in FIG. 15(A) to FIG. 15(F). The shape of the part 171 of the pixel electrode which is exposed by the opening part 170 shown in FIG. 15(A) is a circular shape. The shape of the part 171 of the pixel electrode which is exposed by the opening part 170 shown in FIG. 15(B) to FIG. 15(F) is a polygonal shape. Specifically, the shape of the part 171 of the pixel electrode which is exposed by the opening part 170 shown in FIG. 15(B) is octagonal. The octagon shown in FIG. 15(B) shows an example of a regular octagon. The shape of the part 171 of the pixel electrode which is exposed by the opening part 170 shown in FIG. 15(C) is a hexagonal shape. The hexagon shown in FIG. 15(C) shows an example of a regular hexagon. The shape of the part 171 of the pixel electrode which is exposed by the opening part 170 shown in FIG. 15(D) is a square shape. Although FIG. 15(D) shows a square as an example, as long as it is a quadrangle it may not be a square. The shape of the part 171 of the pixel electrode which is exposed by the opening part 170 shown in FIG. 15(E) shows an example in which the short side and the long side are changed in the rectangle shown in FIG. 1. The shape of the part 171 of the pixel electrode which is exposed by the opening part 170 shown in FIG. 15(F) is an L shape. Furthermore, the shape of the part 171 of the pixel electrode which is exposed by the opening part 170 shown in FIG. 4, FIG. 15(A) to FIG. 15(F) is an example, and the shape of the opening part 170 may be appropriately examined as long as it does not deviate from a shape which satisfies one embodiment of the present invention.

Figure 16:
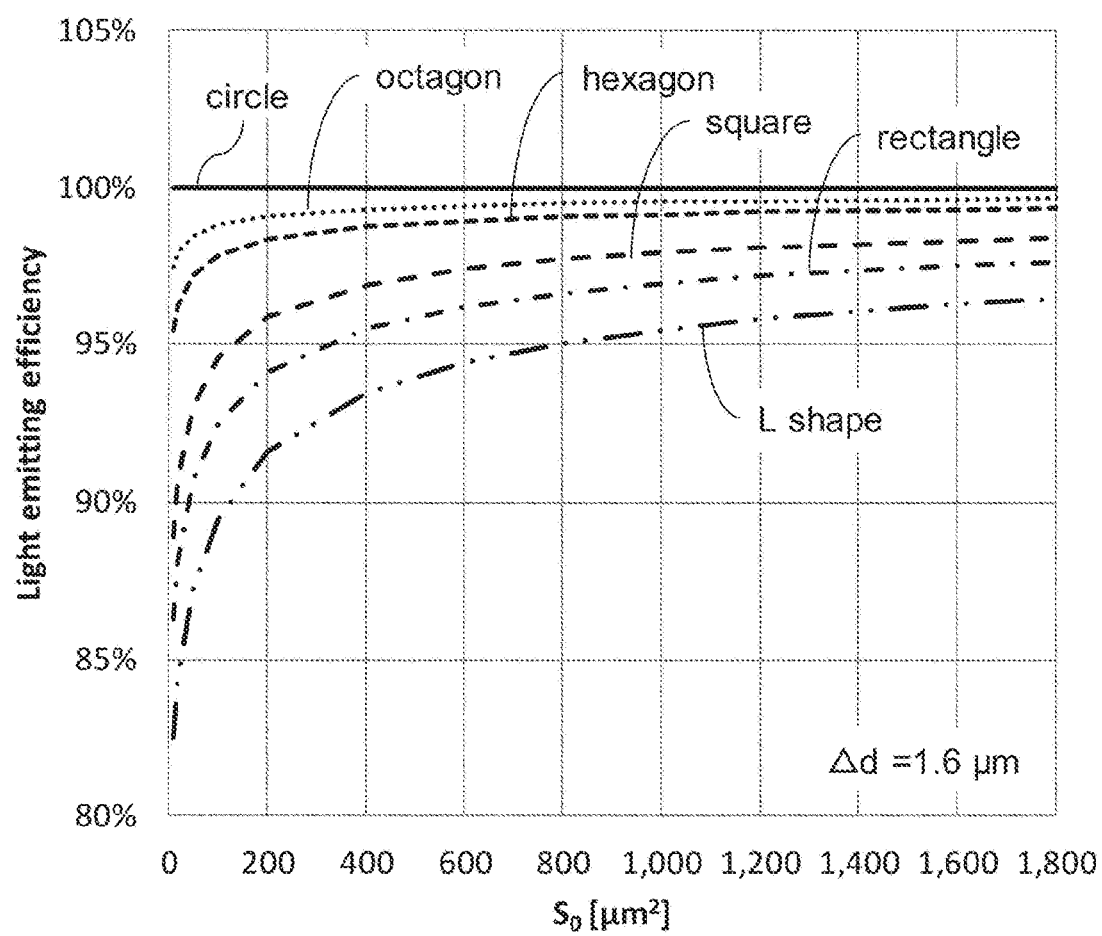
FIG. 16 is a diagram for explaining light emitting efficiency of a display device related to one embodiment of the present invention.

FIG. 16 is a diagram plotting light emitting efficiency with respect to the area $S_0$ of a part 171 of the pixel electrode which is exposed by the opening part 170 in the shape of the part 171 of the pixel electrode which is exposed by the opening part 170 shown in FIG. 15(A) to FIG. 15(F). Here, FIG. 16 shows an example in which the width Δd of the lateral leak current is 1.6 μm. Furthermore, the lateral leak current includes a first leak current and a second leak current.

According to FIG. 16, the shape of a part of the pixel electrode which is exposed by the opening part has a larger light emitting efficiency when it is a regular polygonal shape or a circular shape than a rectangular shape or a square shape. That is, it is understood that the higher the symmetry of the shape of the part of the pixel electrode which is exposed by the opening part, the higher the light emitting efficiency. That is, the greater the symmetry of the shape of a part of the pixel electrode which is exposed by the opening part such as a regular polygonal shape or circular shape, the more possible it becomes to suppress the effects of a lateral leak current. In addition, according to FIG. 16, when the area $S_0$ of a part of the pixel electrode which is exposed by the opening part is smaller than 1000 μm², the ratio of the decrease in light emitting efficiency gradually increases. In addition, according to FIG. 16, when the area $S_0$ of a part of the pixel electrode which is exposed by the opening part is smaller than 600 μm², the ratio of a decrease in light emitting efficiency is further increased. In addition, according to FIG. 16, when the area $S_0$ of a part of the pixel electrode which is exposed by the opening part is smaller than 400 μm², the ratio of the decrease in light emitting efficiency becomes larger. Therefore, when the area $S_0$ of a part of the pixel electrode which is exposed by the opening part is 400 μm² or more, it is possible to suppress a decrease in light emitting efficiency. In addition, preferably, when the area $S_0$ of a part of the pixel electrode which is exposed by the opening part is 600 μm² or more, it is possible to suppress a decrease in light emitting efficiency. More preferably, when the area $S_0$ of a part of the pixel electrode which is exposed by the opening part is 1000 μm² or more, it is possible to suppress a decrease in light emitting efficiency.

As explained above, in the display device according to one embodiment of the present invention, by making the shape of a part of the pixel electrode which is exposed by the opening part into a regular polygonal shape or a circular shape, it is possible to suppress the effects of a lateral leak current. Therefore, in the display device according to one embodiment of the present invention, by making the shape of a part of the pixel electrode which is exposed by the opening part into a regular polygonal shape or a circular shape, it is possible to suppress a decrease in light emitting efficiency of a light emitting element and increase the light emitting efficiency of a light emitting element. In addition, by setting the area of a part of the pixel electrode which is exposed by the opening part to 1000 μm² or more, it is possible to suppress a decrease in light emitting efficiency.

4. Third Embodiment

Figure 17:
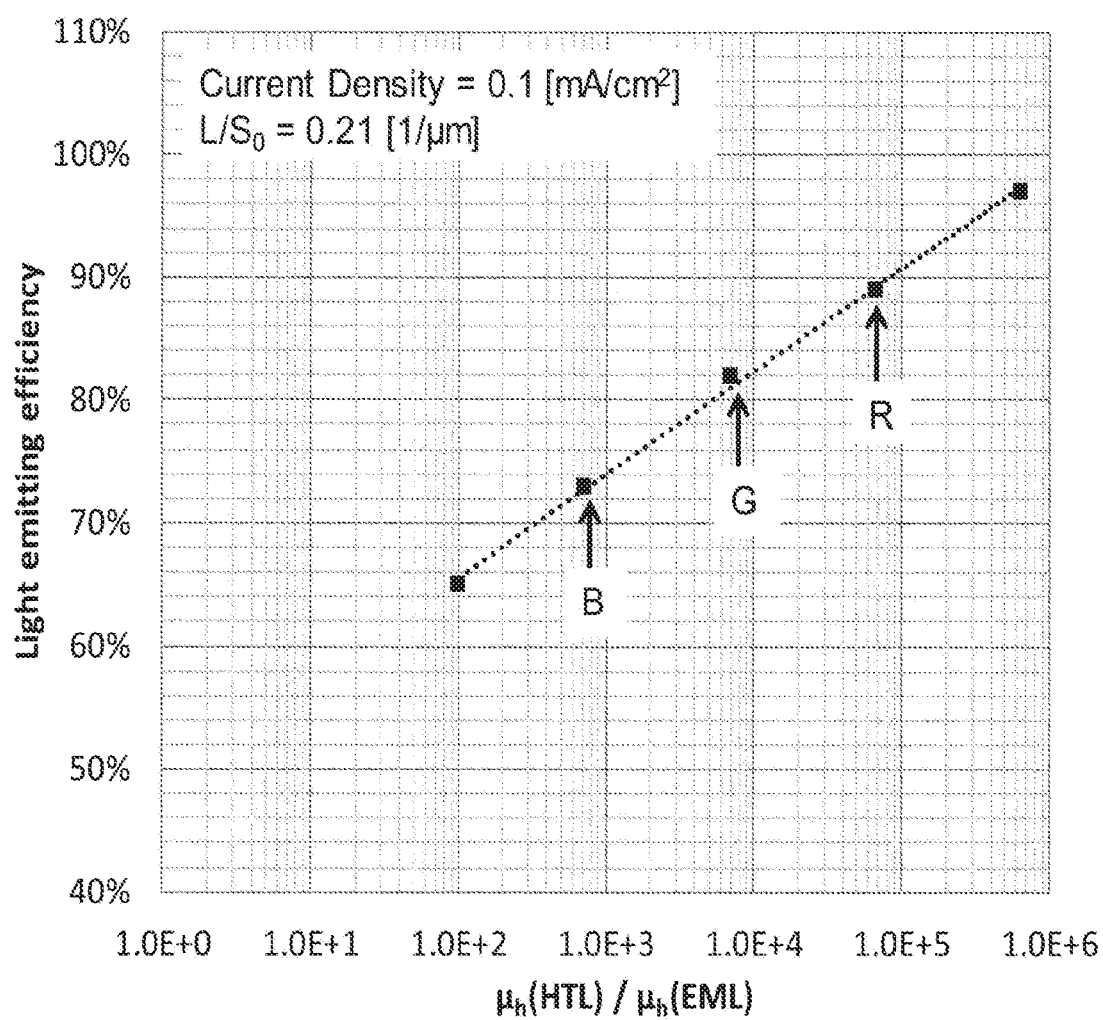
FIG. 17 is a diagram showing light emitting efficiency with respect to a hole mobility ratio of a display device related to one embodiment of the present invention.
Figure 18:
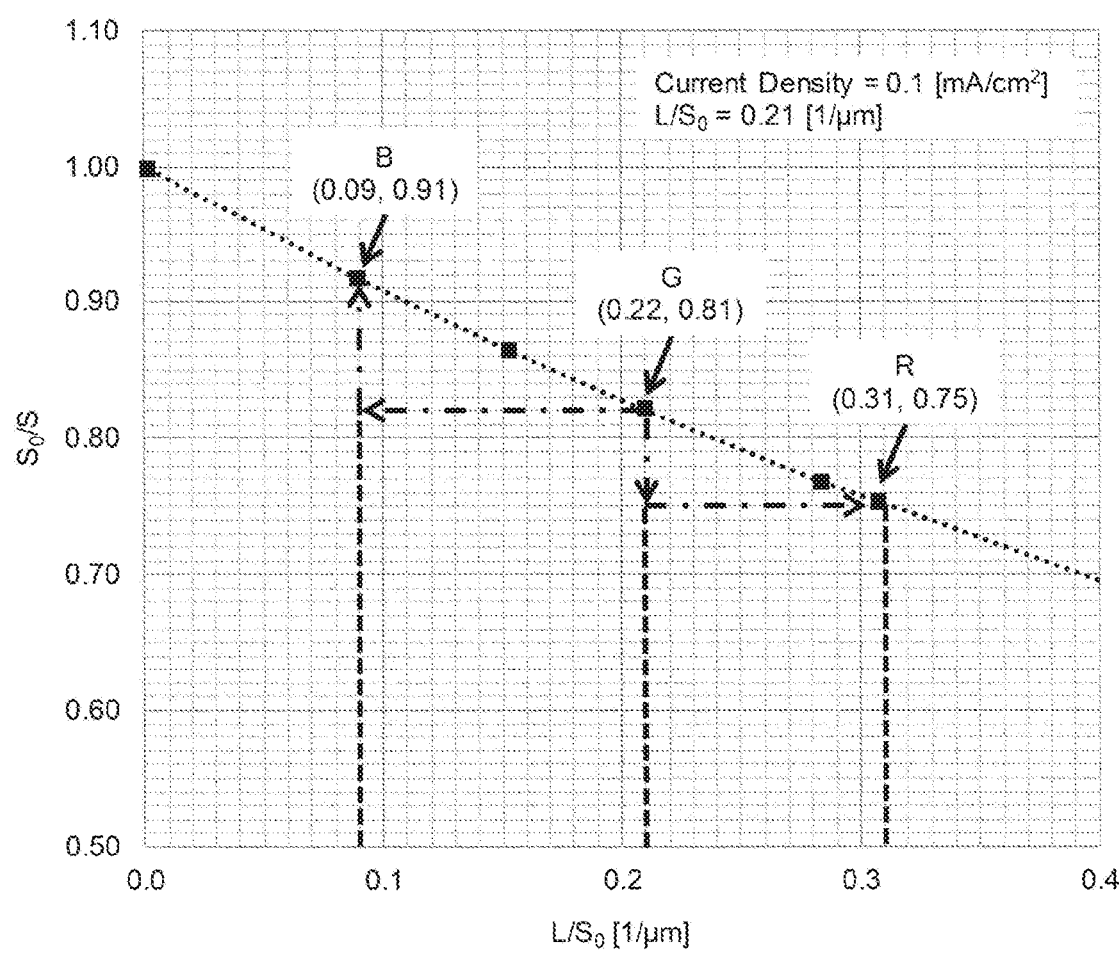
FIG. 18 is a diagram for explaining a light emitting efficiency decrease due to a lateral leak current of a display device related to one embodiment of the present invention.

In the present embodiment, a display device which is different from the first embodiment is explained while referring to FIG. 17 and FIG. 18. Furthermore, an explanation of the background of the invention and the same structure as in the first embodiment and the second embodiment may be omitted.

Generally, as explained in FIG. 4 and FIG. 5, the organic EL display device includes a light emitting element 130R, a light emitting element 130G and a light emitting element 130B. The light emitting layer 164R included in the light emitting element 130R, the light emitting layer 164G included in the light emitting element 130G and the light emitting layer 164B included in the light emitting element 130B are each formed using different materials. The light emitting element 130R, the light emitting element 130G and the light emitting element 130B are made from materials which are appropriately examined for light emitting efficiency, a voltage to be applied and light emitting lifetime and the like according to the specifications and purposes of the display device. Therefore, the ratio of the hole mobility of each of the light emitting element 130R, the light emitting element 130G and the light emitting element 130B is often different.

In the present embodiment, by adjusting the $L/S_0$ of each of the light emitting element 130R, the light emitting element 130G and the light emitting element 130B, the effects of a lateral leak current in each light emitting element is made substantially the same. Specifically, $L/S_0$ of each of the light emitting element 130R, the light emitting element 130G and the light emitting element 130B is reduced in descending order of the ratio of the hole mobility of the light-emitting element 130R, the light-emitting element 130G, and the light-emitting element 130B.

FIG. 17 is a diagram showing light emitting efficiency with respect to the ratio of hole mobility of a display device according to one embodiment of the present invention. Furthermore, in FIG. 17, the shape of a part of the pixel electrode which is exposed by the opening part of each light emitting element is the same. In addition, in FIG. 17 an example is shown in which current density is 0.1 mA/cm² and $L/S_0$ is 0.21. In FIG. 17, the light emitting element 130R has a light emitting efficiency of 89% with respect to the ratio of the hole mobility ratio of 6.4 $e^4$. Similarly, the light emitting element 130G has a light emitting efficiency of 82% with respect to the ratio of the hole mobility ratio of 6.6 $e^3$. Similarly, the light emitting element 130B has a light emitting efficiency of 73% with respect to the ratio of the hole mobility ratio of 7.2 $e^2$.

FIG. 18 shows $S_0/S$ (the decrease in light emitting efficiency) with respect to $L/S_0$ in the display device according to one embodiment of the present invention. FIG. 18 is an extract of a graph of a light emitting efficiency of 0.1 mA/cm² shown in FIG. 14 based on FIG. 12. In addition, the results of adjusting $L/S_0$ are plotted on the extracted graph according to the ratio of the hole mobility of each light emitting element 130R, light emitting element 130G and light emitting element 130B shown in FIG. 17. At this time, $L/S_0$ is reduced in descending order of the ratio of hole mobility. In addition, the light emitting efficiency of each light emitting element 130R, light emitting element 130G and light emitting element 130B was adjusted to be uniform. That is, the light emitting efficiency which was made uniform is 81.3% which is the average of the light emitting efficiency of each of the light emitting element 130R, light emitting element 130G and light emitting element 130B in FIG. 17.

For example, the light emitting element 130G is used as a reference in the display device according to one embodiment of the present invention. The $L/S_0$ in the light emitting element 130G is as follows. In the light emitting element 130G, the light emitting efficiency with respect to a hole mobility ratio of 6.6 $e^3$ is 82%. The light emitting efficiency which was made uniform of 81.3% is 99.1% of the light emitting efficiency of 82% of the light emitting element 130G. In FIG. 17, since $L/S_0$ is 0.21, $L/S_0$ after adjustment of the light emitting element 130G is 0.21 divided by 99.1% which is 0.22. Therefore, the $L/S_0$ of the light emitting element 130G is 0.22 and the $S_0/S$ is 0.81.

In the light emitting element 130R, light emitting efficiency with respect to the ratio of hole mobility of 6.4 $e^4$ is 89%. The light emitting efficiency which was made uniform of 81.3% is 91.3% of the light emitting efficiency of the light emitting element 130R of 89%. When the light emitting element 130G is used as a reference, 91.3% is 0.75 with respect to a light emitting efficiency of 82%. That is, $S/S_0=0.75$. From the graph in FIG. 18, when $S/S_0=0.75$, $L/S_0$ is 0.31. Therefore, the $L/S_0$ of the light emitting element 130R is 0.31 and the $S_0/S$ is 0.75. Similarly, in the light emitting element 130B, the light emitting efficiency with respect to the ratio of the hole mobility of 7.2 $e^2$ is 73%. The light emitting efficiency which was made uniform of 81.3% is 111.4% of the light emitting efficiency of 73% of the light emitting element 130B. When the light emitting element 130G is used as a reference, 111.4% is 0.91 with respect to a light emitting efficiency of 82%. That is, $S/S_0=0.91$. From the graph in FIG. 18, when $S/S_0=0.91$, L/S₀ is 0.09. Therefore, the L/S₀ of the light emitting element 130B is 0.09, and the S₀/S is 0.91.

As explained above, in each light emitting element 130R, light emitting element 130G and light emitting element 130B, by decreasing L/S₀ in descending order of the ratio of hole mobility, it is possible to suppress the occurrence of lateral leak current. In addition, by setting the lateral leak current to be substantially the same in each light emitting element 130R, light emitting element 130G and light emitting element 130B, it is possible to make the current density dependence of the light emitting efficiency uniform. Furthermore, it is also possible to make chromaticity uniform by making the lateral leak currents substantially the same in each light emitting element 130R, light emitting element 130G and light emitting element 130B. As a result, it is possible to improve the display quality of the display device.

5. Fourth Embodiment

In the present embodiment, a display device according to one embodiment of the present invention is explained while referring to FIG. 19 to FIG. 28. Furthermore, explanations of the background of the invention and structures the same as the first to third embodiments may be omitted. In addition, in FIG. 19 to FIG. 28, illustrations of the electron injection layer, the electron blocking layer, the hole blocking layer and the hole injection layer are omitted.

In some organic EL materials included in an organic EL display device, the dipole moment is oriented depending on the shape of the molecule included in the organic EL material. For example, when the dipole moment of the molecule is oriented, an internal electric field is generated due to spontaneous polarization.

Figure 19:
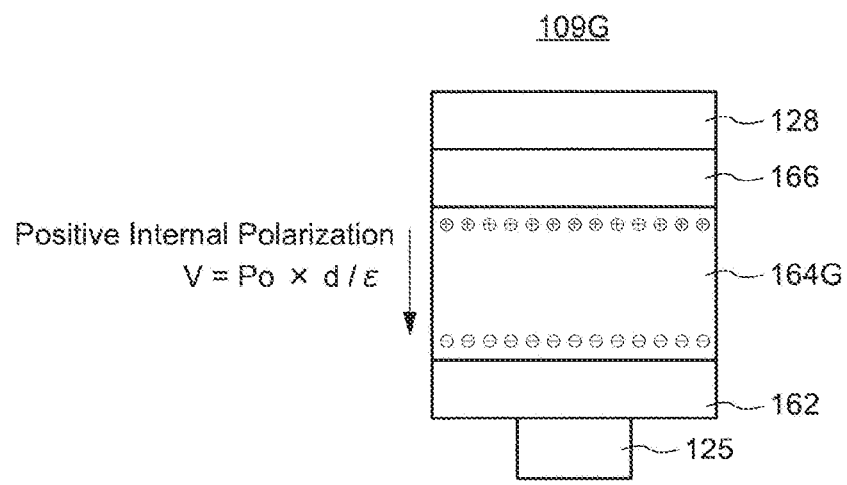
FIG. 19 is a diagram for explaining a positive internal polarization in a light emitting element of a display device related to one embodiment of the present invention.

FIG. 19 is an example in which a positive internal electric field is generated in the light emitting layer 164G of the light emitting element 130G of the pixel 109G. When the positive internal electric field is V, the thickness of the light emitting layer 164G is d, the spontaneous polarization is P₀, the dielectric constant in a vacuum is ε₀, and a relative dielectric constant is $\varepsilon_r$, then V=P₀×d/ε, ε=(εᵣ−1)ε₀. When an internal electric field is generated in a light emitting element, the injection of holes and electrons occurs at a low voltage compared to when no internal electric field is generated. Holes and electrons continue to be injected until the internal electric field is canceled out in the light emitting element. Therefore, holes or electrons are accumulated within the light emitting layer, for example, until the internal electric field is canceled out in the light emitting element. Furthermore, FIG. 19 shows an example in which V is 0 or less.

Figure 20:
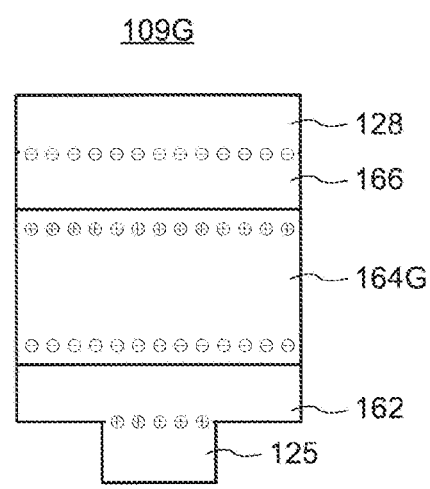
FIG. 20 is a diagram for explaining a positive internal polarization in a light emitting element of a display device related to one embodiment of the present invention.

FIG. 20 is an example of the state of holes or electrons when the difference in the voltage applied to the pixel electrode 125 and the voltage applied to the opposing electrode is in the vicinity of 0V. An example is shown in which a positive voltage is applied to the pixel electrode 125, and 0V, for example, is applied to the opposing electrode 128. Therefore, holes are excited in the vicinity of the pixel electrode 125 and electrons are excited in the vicinity of the opposing electrode 128.

Figure 21:
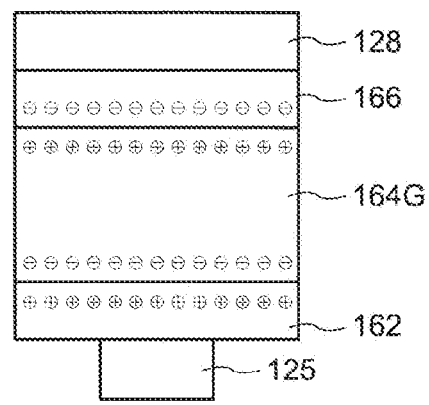
FIG. 21 is a diagram for explaining a positive internal polarization in a light emitting element of a display device related to one embodiment of the present invention.

FIG. 21 is an example of the state of holes and electrons when the difference between the voltage applied to the pixel electrode 125 and the voltage applied to the opposing electrode is larger than 0V. Holes move from the hole transporting layer 162 toward the light emitting layer 164G, and electrons move from the electron transporting layer 166 toward the light emitting layer 164G. That is, the holes and electrons excited by a positive internal electric field and the holes and the electrons which have moved stay in the vicinity of the light emitting layer 164G. Holes which are wider than a width of the pixel electrode 125 spread, and a lateral leak current is generated. That is, holes spread also in pixels other than desired pixels and a lateral leak current occurs.

Figure 22:
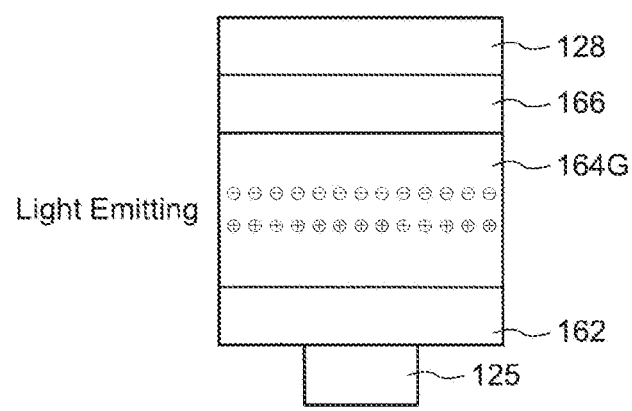
FIG. 22 is a diagram for explaining a positive internal polarization in a light emitting element of a display device related to one embodiment of the present invention.

FIG. 22 is an example of the state of holes and electrons when the difference between the voltage applied to the pixel electrode 125 and the voltage applied to the opposing electrode is equal to or higher than the voltage when the light emitting element 130G emits light. When a voltage is continuously applied to the pixel electrode 125 and the opposing electrode, the holes and the electrons which are excited by a positive internal electric field are canceled out by the holes and the electrons which move. Furthermore, when the voltage at which the light emitting element 130G emits light is exceeded due to the holes and the electrons which have moved, the light emitting element 130G emits light.

Figure 23:
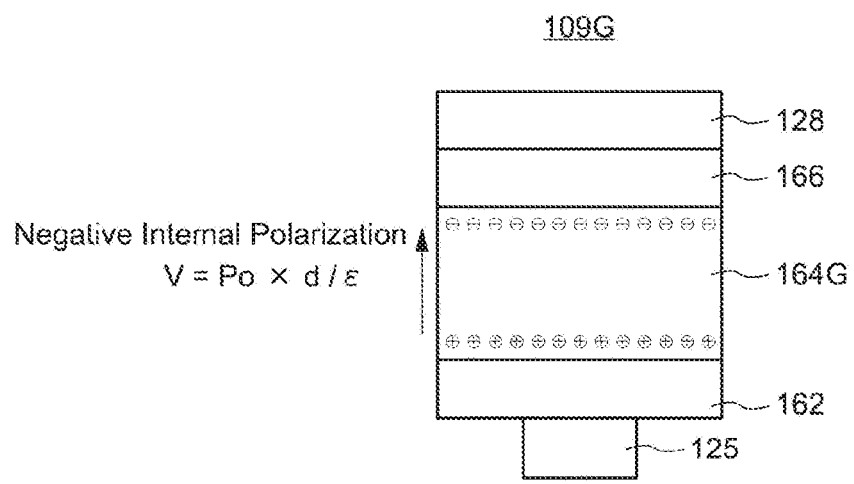
FIG. 23 is a diagram for explaining a negative internal polarization in a light emitting element of a display device related to one embodiment of the present invention.

FIG. 23 is an example in which a negative internal electric field is generated in the light emitting layer 164G. The direction of the negative internal electric field is a direction from the side where holes are injected into the light emitting layer to the side where electrons are injected into the light emitting layer. Similar to the positive internal electric field explained in FIG. 19, when the negative internal electric field is V, the thickness of the light emitting layer 164G is d, the spontaneous polarization is P₀, the dielectric constant in a vacuum is ε₀, and the relative dielectric constant is $\varepsilon_r$, then V=P₀×d/ε, ε=(εᵣ−1)ε₀. Furthermore, while the positive internal electric field is from the opposing electrode 128 side toward the pixel electrode 125 side, the negative internal electric field is from the pixel electrode 125 side toward the opposing electrode 128 side. That is, the directions of the positive internal electric field and the negative internal electric field are the reverse of each other.

Figure 24:
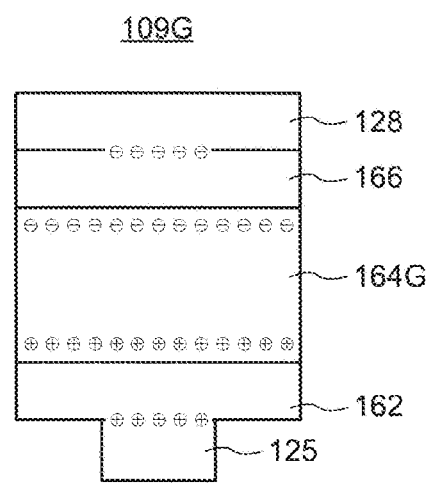
FIG. 24 is a diagram for explaining a negative internal polarization in a light emitting element of a display device related to one embodiment of the present invention.

FIG. 24 is an example of the state of holes or electrons when the difference between the voltage applied to the pixel electrode 125 and the voltage applied to the opposing electrode is in the vicinity of 0V. An example is shown in which a positive voltage is applied to the pixel electrode 125 and 0 V, for example, is applied to the opposing electrode 128. Therefore, holes are excited in the vicinity of the pixel electrode 125 and electrons are excited in the vicinity of the opposing electrode 128.

Figure 25:
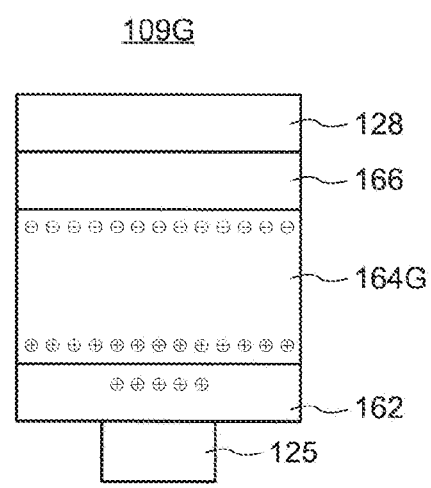
FIG. 25 is a diagram for explaining a negative internal polarization in a light emitting element of a display device related to one embodiment of the present invention.

FIG. 25 is an example of the state of holes and electrons when the difference between a voltage applied to the pixel electrode 125 and a voltage applied to the opposing electrode is larger than 0V. Holes move from the hole transporting layer 162 toward the light emitting layer 164G, and electrons move from the electron transporting layer 166 toward the light emitting layer 164G. When a negative internal electric field is generated in the light emitting layer 164G, holes move from the hole transporting layer 162 toward the light emitting layer 164G to the holes excited by the negative internal electric field. When a negative internal electric field is generated in the light emitting layer 164G, electrons move from the electron transporting layer 166 toward the light emitting layer 164G to electrons excited by the negative internal electric field. Therefore, holes and electrons do not stay in the vicinity of the light emitting layer 164G. Therefore, holes wider than the width of the pixel electrode 125 do not spread, and a lateral leak current does not occur. That is, holes do not spread to pixels other than desired pixels and a lateral leak current does not occur.

Figure 26:
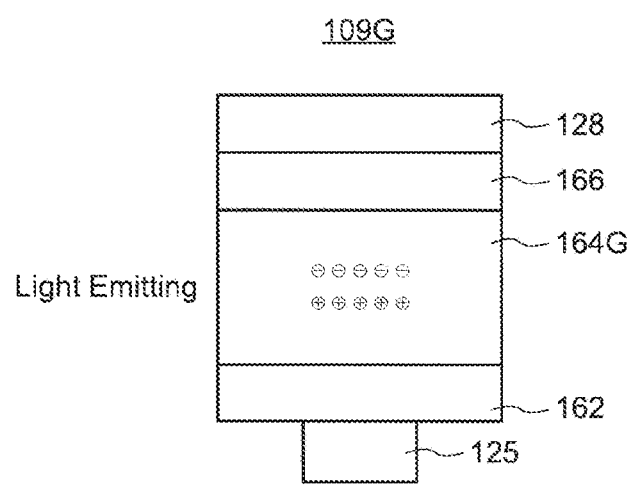
FIG. 26 is a diagram for explaining a negative internal polarization in a light emitting element of a display device related to one embodiment of the present invention.

FIG. 26 is an example of a state of holes and electrons when the difference between a voltage applied to the pixel electrode 125 and a voltage applied to the opposing electrode is equal to or higher than the voltage at which the light emitting element 130G emits light. When the difference between the voltage applied to the pixel electrode 125 and the voltage applied to the opposing electrode becomes equal to or higher than the voltage at which the light emitting element 130G emits light, the light emitting element 130G emits light.

Figure 27:
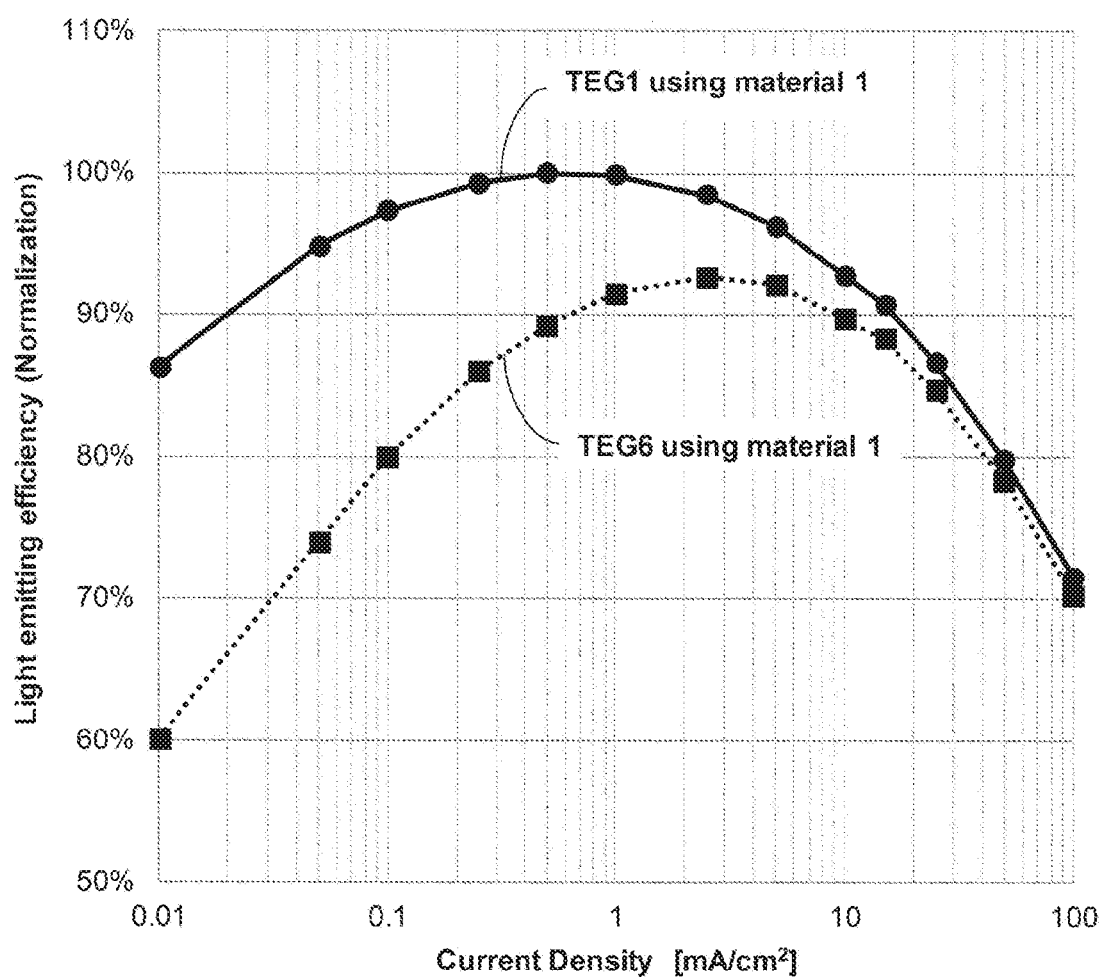
FIG. 27 is a diagram showing light emitting efficiency with respect to current density in a positive internal polarization in a light emitting element of a display device related to one embodiment of the present invention.

FIG. 27 is a diagram showing current density and light emitting efficiency in TEG1 and TEG6 using the material 1 for the light emitting layer 164G. Furthermore, the material 1 is a material that generates a positive internal electric field. For example, a material based on aluminum quinoline (Alq) is an example of a material that produces a positive internal electric field. As explained in FIG. 12, TEG1 has an area of a part of the pixel electrode which is exposed by the opening part of 2000 μm×2000 μm. In TEG5, the area of a part of the pixel electrode which is exposed by the opening part is 30 μm×30 μm. It can be understood that the smaller the area of a part of the pixel electrode which is exposed by the opening, the lower the light emitting efficiency. In the present specification, as explained in FIG. 12, it is assumed that that TEG1 does not generate a lateral leak current since the area of a part of the pixel electrode which is exposed by the opening part is very large. However, when a material which generates a positive internal electric field is used for the light emitting layer 164G, light emitting efficiency does not reach 100% even when the current density of TEG1 is 0.01 mA/cm$^2$. That is, from FIG. 27, it can be understood that a lateral leak current is generated when a material which generates a positive internal electric field is used for the light emitting layer 164G.

Figure 28:
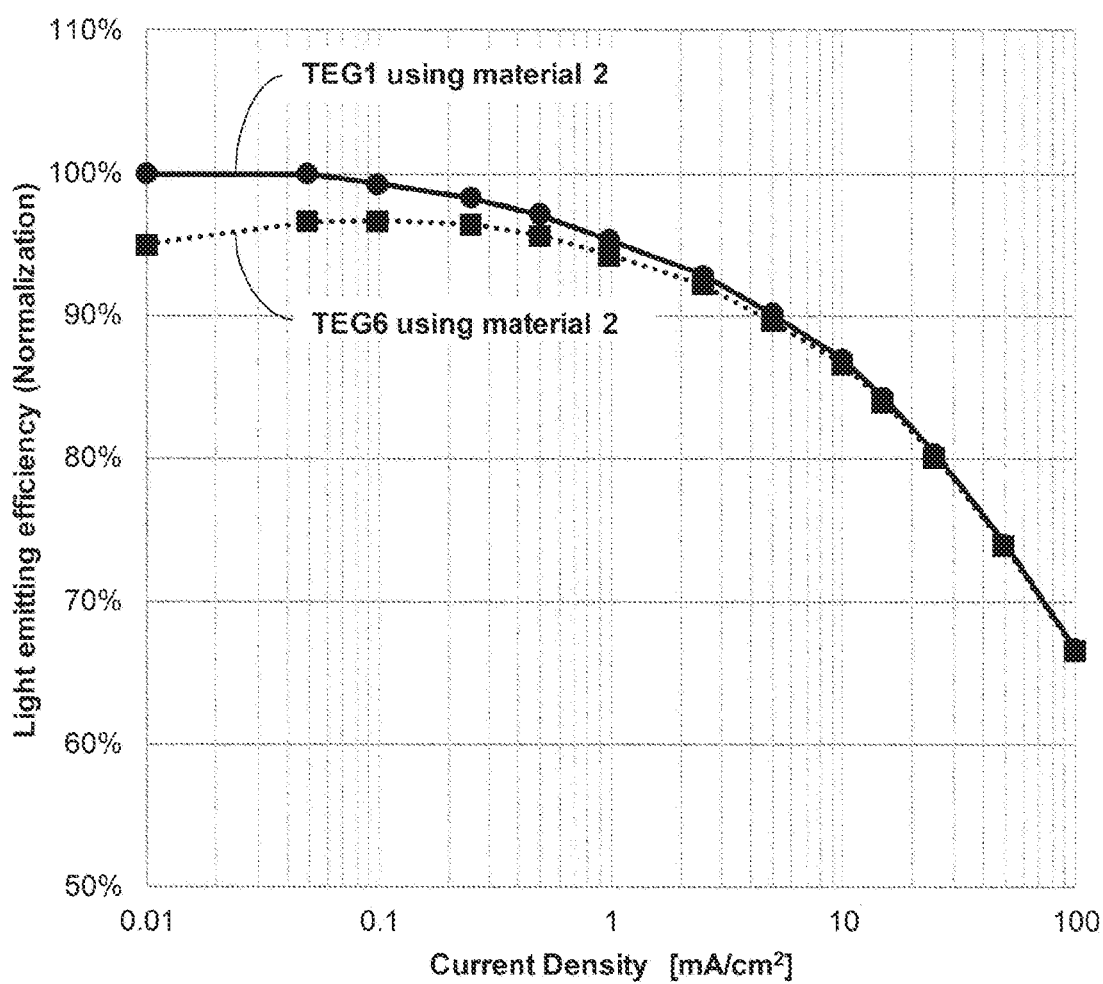
FIG. 28 is a diagram showing light emitting efficiency with respect to current density in a negative internal polarization in a light emitting element of a display device related to one embodiment of the present invention.

FIG. 28 is a diagram showing current density and light emitting efficiency in TEG1 and TEG6 using the material 2 for the light emitting layer 164G. Furthermore. the material 2 is a material which generates a negative internal electric field. For example, Al (7-Prg) 3 is an example of a material which generates a negative internal electric field. When a material which generates a negative internal electric field is used for the light emitting layer 164G, the light emitting efficiency is 100% even when the current density of TEG1 is 0.01 mA/cm$^2$. In addition, when a material which generates a negative internal electric field is used for the light emitting layer 164G, compared with the case where a material which generates a positive internal electric field is used for the light emitting layer 164G, the light emitting efficiency is high even when the area a part of the pixel electrode which is exposed by the opening part is small. That is, from FIG. 28, it is possible to suppress a leak current in a lateral direction by using a material which generates a negative internal electric field for the light emitting layer 164G.

FIG. 19 to FIG. 28 show examples in which a leak current in a lateral direction can be suppressed by using a material which generates a negative internal electric field with respect to the light emitting layer 164G of the light emitting element 130G of the pixel 109G. In the present embodiment also, similar to the background of the invention and Embodiments 1 to 3, the lateral leak current includes the first leak current and the second leak current. In addition, the negative internal electric field is generated in at least one of the light emitting layer 164R of the light emitting element 130R of the pixel 109R, the light emitting layer 164G of the light emitting element 130G of the pixel 109G, and the light emitting layer 164B of the light emitting element 130B of the pixel 109B. Similar to the light emitting layer 164G, a material which generates a negative internal electric field in the light emitting layer 164R and the light emitting layer 164B may be selected as appropriate. Furthermore, a negative internal electric field may also occur in either a hole transporting layer or a hole blocking layer. Similar to the light emitting layer 164G, a material which generates a negative internal electric field may be appropriately selected for the hole transport layer and the hole blocking layer.

In the present specification, an example is shown in which the pixel electrode is an anode. The pixel electrode may also be a cathode. When the pixel electrode is a cathode, for example, the stacking order of the cross sections shown in FIG. 19 to FIG. 26 is reversed. That is, from the bottom, the opposing electrode 128, the electron injection layer 167, the electron transport layer 166, the hole blocking layer 165 (not shown), the light emitting layer 164G, the electron blocking layer 163, the hole transport layer 162, the hole injection layer 161, and the pixel electrode 125. At this time, the direction of the negative internal electric field is a direction from the side where electrons are injected into the light emitting layer to the side where holes are injected into the light emitting layer.

As explained above, by using a material which generates a negative internal electric field in a light emitting element, it is possible to suppress the spread of holes to pixels other than a desired pixel. As a result, it is possible to suppress the occurrence of a lateral leak current. In addition, as a result, it is possible to suppress a decrease in light emitting efficiency. By using a material which generates a negative internal electric field in a light emitting element, it is possible to improve the display quality of the display device.

6. Fifth Embodiment

In the present embodiment, a method for manufacturing a display device is explained while referring to FIG. 29 to FIG. 32. Furthermore, an explanation of the background of the invention and the same structures as those of the first to fourth embodiments may be omitted.

FIG. 29 to FIG. 32 are cross-sectional views for explaining a method of manufacturing a display device according to one embodiment of the present invention. Furthermore, FIG. 29 to FIG. 32 show cross-sections of three pixels, pixel 109R, pixel 109G and pixel 109B included in the display part 103.

Figure 29:
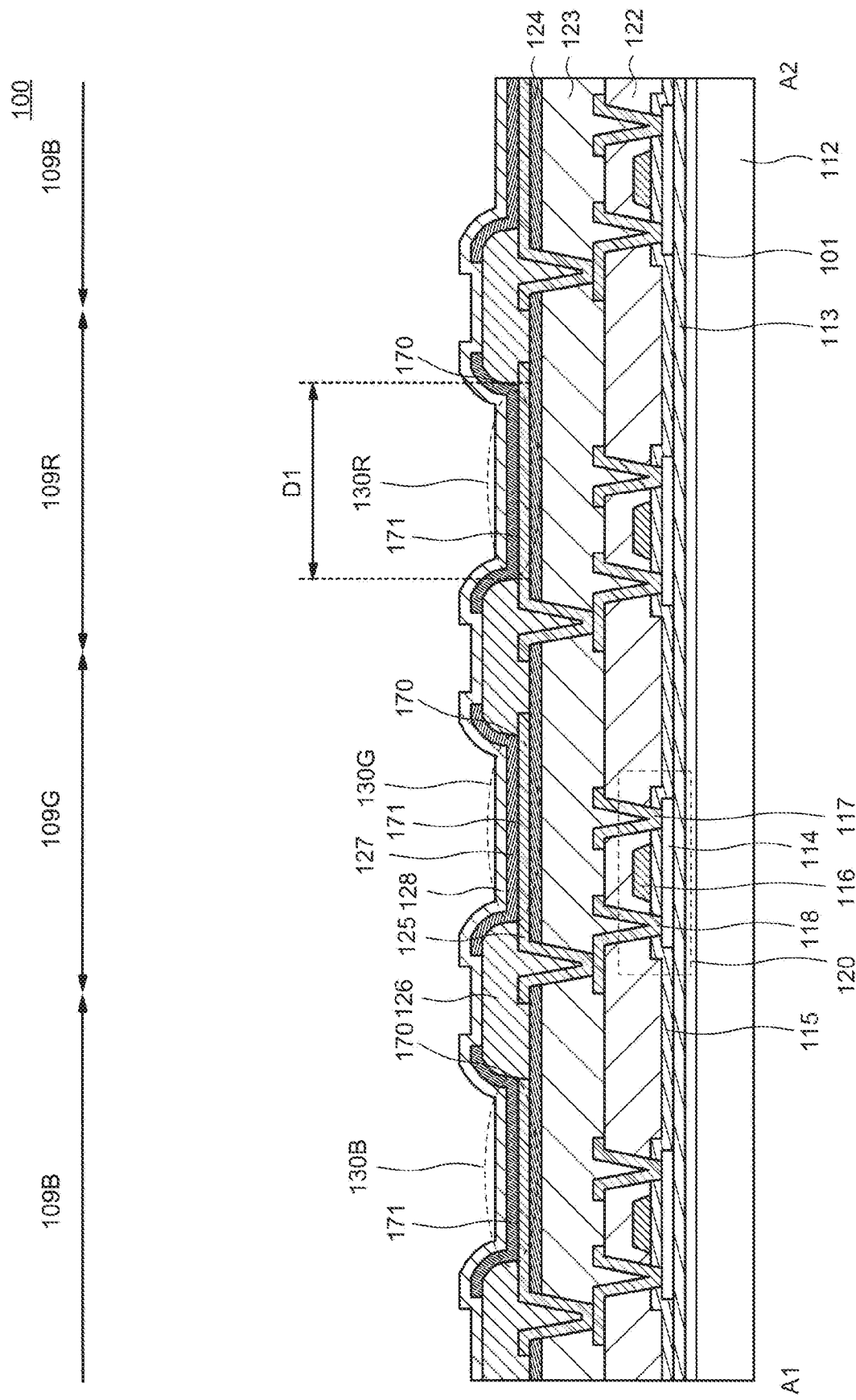
FIG. 29 is a schematic diagram of a cross part along the line A1-A2 of the display device shown in FIG. 1.

As is shown in FIG. 29, the display device 100 includes a first substrate 101 and a second substrate 112. For example, a glass substrate, a quartz substrate or a flexible substrate (polyimide, polyethylene terephthalate or other resin substrate having flexibility) can be used for the first substrate 101 and the second substrate 112. In the case when it is not necessary that the first substrate 101 and the second substrate 112 have light transmitting properties, a metal substrate, a ceramic substrate or a semiconductor substrate may be used. In the present embodiment, polyimide is used for the first substrate 101 and polyethylene terephthalate is used for the second substrate 112.

First, an underlayer film 113 is formed above the first substrate 101. The underlayer film 113 is an insulating layer. The material for forming the underlayer film 113 is, for example, an inorganic material such as silicon oxide, silicon nitride or aluminum oxide. In the present embodiment, although an example is shown in which the underlayer film 113 is formed using one layer, it may also be formed by stacking a silicon oxide layer and a silicon nitride layer, for example. The underlayer film 113 may be appropriately determined in consideration of adhesion to the first substrate 101 and gas barrier properties to the transistor 120 which is described herein.

Next, the transistor 120 is formed above the underlayer film 113. The structure of the transistor 120 may be a top gate type or a bottom gate type structure. In the present embodiment, the transistor 120 includes a semiconductor layer 114 arranged above the underlayer film 113, a gate insulating film 115 which covers the semiconductor layer 114, and a gate electrode 116 arranged above the gate insulating film 115. In addition, an interlayer insulating layer 122 which covers the gate electrode 116 is formed above the transistor 120. Furthermore, a source or drain electrode 117 and a source or drain electrode 118 are formed above the interlayer insulating layer 122. The source or drain electrode 117 and the source or drain electrode 118 are electrically connected to the semiconductor layer 114. Furthermore, in the present embodiment, although an example is shown in which the interlayer insulating layer 122 is formed using one layer. the interlayer insulating layer 122 may also be formed by stacking two or more layers for example.

Any known material may be used as the material of each layer which forms the transistor 120 and is not particularly limited. For example, polysilicon, amorphous silicon, or an oxide semiconductor can be used as a material for forming the semiconductor layer 114. For example, silicon oxide or silicon nitride can be used as a material for forming the gate insulating film 115. For example, a metal material such as copper, molybdenum, tantalum, tungsten, or aluminum can be used as a material for forming the gate electrode 116. For example, silicon oxide or silicon nitride can be used as a material for forming the interlayer insulating layer 122. A metal material such as copper, titanium, molybdenum or aluminum can be used as a material for forming the source or drain electrode 117 and the source or drain electrode 118.

Furthermore, although omitted from the diagram, it is possible to arrange a first wiring which is formed from the same metal material as the metal material for forming the gate electrode 116 in the same layer as the gate electrode 116. The first wiring is, for example, a scanning signal line which is driven by the scanning signal line driving circuit 104. In addition, although omitted from the diagram, a second wiring which extends in a direction intersecting the first wiring can be arranged in the same layer as the source or drain electrode 117 and the source or drain electrode 118. The second wiring is, for example, an image signal line which is driven by the image signal line driving circuit.

Next, a planarization film 123 is formed above the transistor 120. The planarization film 123 includes an organic resin material. A known organic resin material can be used as the organic resin material. For example, the organic resin material is polyimide, polyamide, acrylic and epoxy or the like. The planarization film 123 can relieve unevenness in the gate electrode 116, the source or drain electrode 117 and the source electrode or the drain electrode 118 which form the transistor 120, and can make the surface of the film substantially flat. The planarization film 123 is formed by, for example, a solution coating method. Furthermore, in the present embodiment, although an example is shown in which the planarization film 123 is formed from one layer, for example, a layer containing an organic resin material and an inorganic insulating layer may be stacked and formed.

Next, a contact hole is formed in the planarization film 123. The contact hole exposes a part of the source electrode or the drain electrode 118. In addition, the pixel electrode 125 and the source or drain electrode 118 described herein are electrically connected to each other through the contact hole. Therefore, the contact hole is arranged so as to overlap a part of the source electrode or the drain electrode 118. The source or drain electrode 118 is exposed at the bottom surface of the contact hole.

Next, a protective film 124 is formed above the planarization film 123. The protective film 124 overlaps the contact hole which is formed in the planarization film 123. The protective film 124 preferably has a barrier function against moisture and oxygen. For example, a silicon nitride film or an inorganic insulating material such as aluminum oxide can be used as a material for forming the protective film 124.

Next, the pixel electrode 125 is formed above the protective film 124. The pixel electrode 125 is electrically connected to the source electrode or the drain electrode 118 via a contact hole arranged in the protective film 124 and the planarization film 123. In the display device 100 of the present embodiment, the pixel electrode 125 functions as an anode which forms the light emitting element 130. The pixel electrode 125 has a different structure depending on whether the display device 100 has a top emission type or a bottom emission type structure. For example, in the case when the display device 100 is a top emission type, a metal material which has a high reflectance is used as a material for forming the pixel electrode 125. In addition, in the case where the display device 100 is a top emission type, the material for forming the pixel electrode 125 may be an indium oxide based transparent conductive material (for example, Indium Tin Oxide (ITO)) or a stacked structure of a metal material and a transparent conductive material with a high work function such as a zinc oxide based transparent conductive material (for example, Indium Zinc Oxide (IZO), Zinc Oxide (ZnO)). In addition, for example, in the case where the display device 100 is a bottom emission type, the transparent conductive material described above is used as the material of the pixel electrode 125. In the present embodiment, a top emission type organic EL display device is explained as an example.

A first insulating layer 126 is formed above the pixel electrode 125. An organic resin material is used as a material for forming the first insulating layer 126. For example, known resin materials such as polyimide type, polyamide type and acrylic type can be used as the organic resin material. The first insulating layer 126 has an opening part 170. The opening part 170 exposes a part of the pixel electrode 125 (part 171 of the exposed pixel electrode). The first insulating layer 126 is arranged so as to cover the periphery part (end part, edge part) of the pixel electrode 125 between adjacent pixel electrodes 125. Therefore, the first insulating layer 126 functions as a member which separates adjacent pixel electrodes 125. The first insulating layer 126 is also generally called a "partition wall" or a "bank". It is preferred that the inner wall of the opening part 170 of the first insulating layer 126 has a tapered shape. By forming the inner wall of the opening part 170 of the first insulating layer 126 with a tapered shape, it is possible to reduce poor coverage at the end part of the pixel electrode 125 at the time of forming a light emitting layer described herein. In addition, the first insulating layer 126 may not only cover the end part of the pixel electrode 125 but may also function as a filling material which fills a concave part caused by the contact hole of the planarization film 123 and the protective film 124.

An organic layer 127 is formed above the pixel electrode 125. The organic layer 127 has at least a light emitting layer made of an organic material, and at least a part of the light emitting layer functions as a light emitting region of the light emitting element 130. In addition to the light emitting layer, the organic layer 127 includes various layers such as a hole injection layer, a hole transport layer, an electron injection layer and an electron transport layer described in FIG. 2. The organic layer 127 is arranged so as to cover the opening part 170 of the first insulating layer 126. That is, among the plurality of organic layers, the pixel electrode 125 come into contact with the layer closest to the pixel electrode 125 due to the opening part 170.

Furthermore, in the present embodiment, an organic layer 127 which includes a light emitting layer which emits light of a desired color is arranged. In addition, in the present embodiment, by forming the organic layer 127 including different light emitting layers above each pixel electrode 125, a structure can be obtained in which each color of RGB is displayed. In the present embodiment, the light emitting layer of the organic layer is discontinuous between adjacent pixel electrodes 125. Furthermore, the organic layer 127 can be formed using a known structure or a known material, and is not particularly limited to the structure of the present embodiment.

An opposing electrode 128 is formed above the organic layer 127 and the first insulating layer 126. The opposing electrode 128 functions as a cathode which forms the light emitting element 130. Since the display device 100 of the present embodiment is a top emission type, a transparent electrode is used for the opposing electrode 128. A MgAg thin film or a transparent conductive layer using a material such as ITO or IZO is used as the thin film for forming the transparent electrode. The opposing electrode 128 is also arranged above the first insulating layer 126 so as to form a bridge between the pixel 109R, the pixel 109G and the pixel 109B. The opposing electrode 128 is electrically connected to an external terminal via a lower conductive layer in the periphery region near the end of the display part 103. As described above, in the present embodiment, the light emitting element 130 is formed with a part (anode) of the pixel electrode 125 which is exposed from the first insulating layer 126, an organic layer, and an opposing electrode 128 (cathode).

Figure 30:
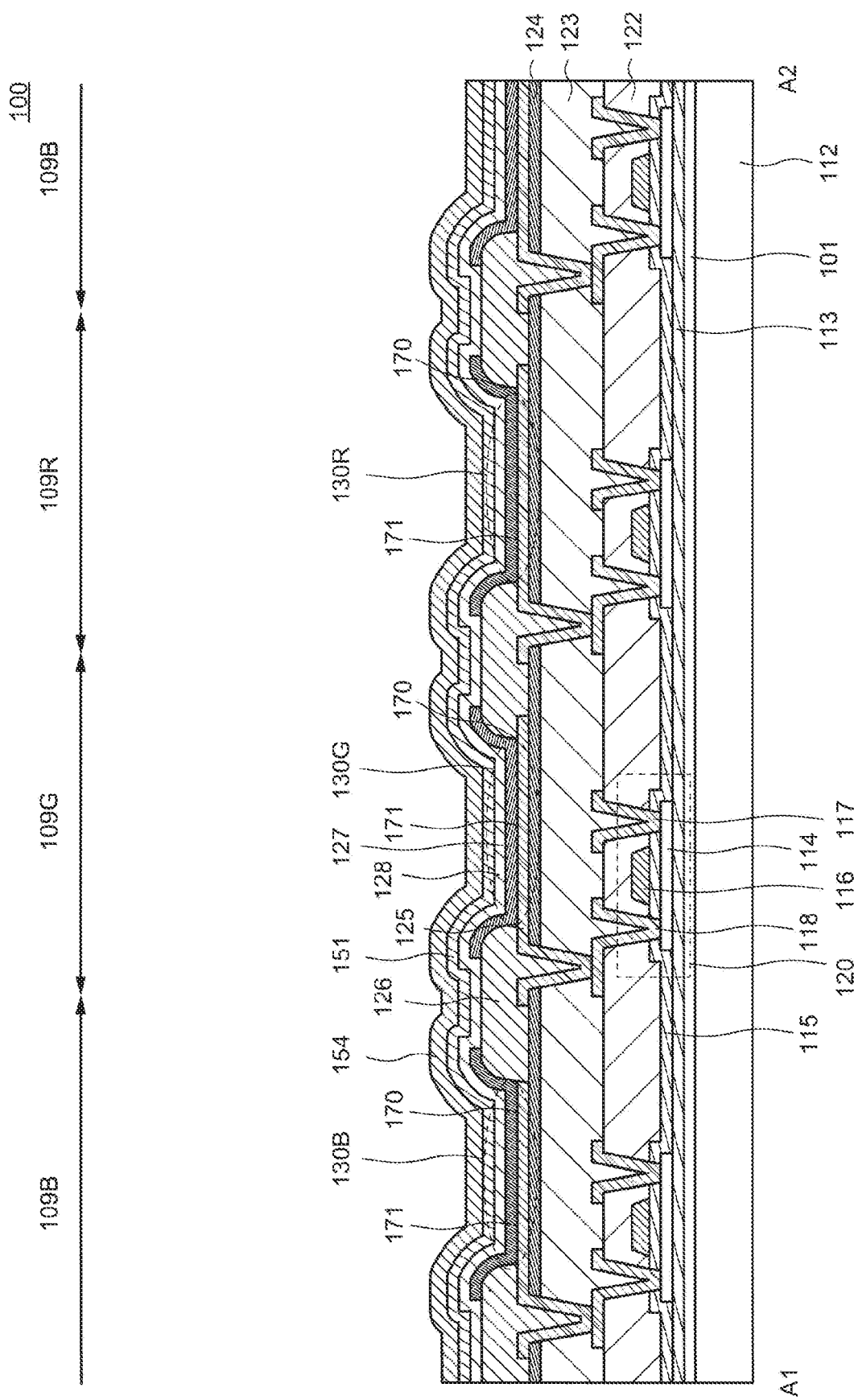
FIG. 30 is a schematic diagram of a cross part along the line A1-A2 of the display device shown in FIG. 1.

Next, as is shown in FIG. 30, an optical path length adjusting film 151 and an optical path length adjusting film 154 are formed above each light emitting element in the pixels 109R, 109G and 109B. It is possible to for the optical path length adjusting film 151 and the optical path length adjusting film 154 using an inorganic insulating material such as silicon oxide ($SiO_2$), for example. Although FIG. 4 shows an example in which the optical path length adjusting films are formed of two layers on each light emitting element, the optical path length adjusting film formed on each light emitting element may also be one layer or may be three or more layers.

Figure 31:
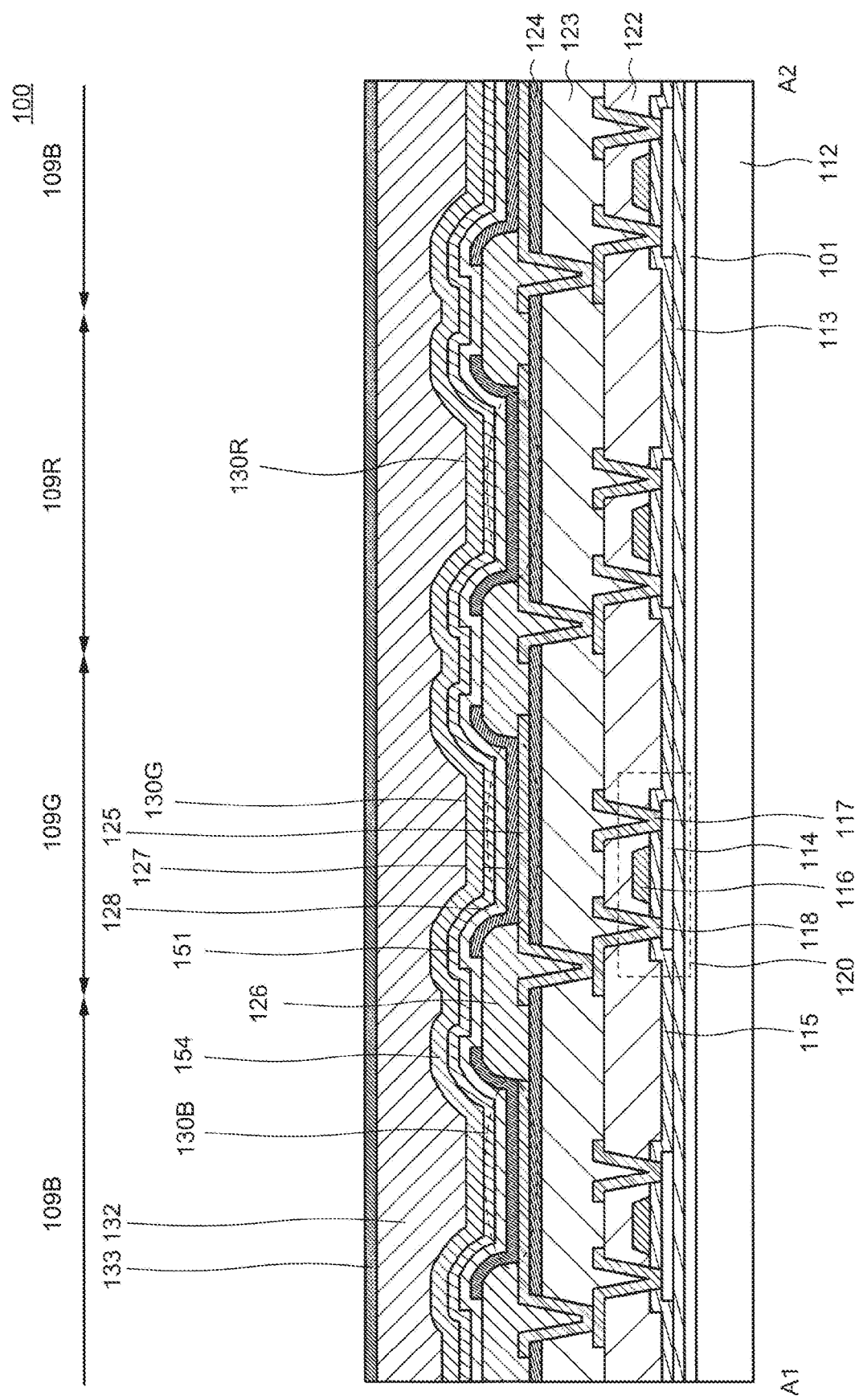
FIG. 31 is a schematic diagram of a cross part along the line A1-A2 of the display device shown in FIG. 1.

Next, as is shown in FIG. 31, an organic insulating layer 132 and an inorganic insulating layer 133 are formed above the display part 103. The organic insulating layer 132 and the inorganic insulating layer 133 function as a sealing film for preventing water and oxygen from entering the light emitting element 130. By arranging the sealing film above the display part 103, it is possible to prevent water and oxygen from entering the light emitting element 130, and it is possible to improve the reliability of the display device. For example, silicon nitride ($Si_xN_y$), silicon oxynitride ($SiO_xN_y$), silicon nitride oxide ($SiN_xO_y$), or the like can be used as a material for forming the inorganic insulating layer 133 (x, y and z are arbitrary). In addition, a polyimide resin, an acrylic resin, or the like can be used as a material for forming the organic insulating layer 132. Furthermore, the film thickness of the organic insulating layer 132 is set to about 1 μm or more and about 20 μm or less. The thickness of the inorganic insulating layer 133 is set to about 0.1 μm or more and about 3 μm or less.

Figure 32:
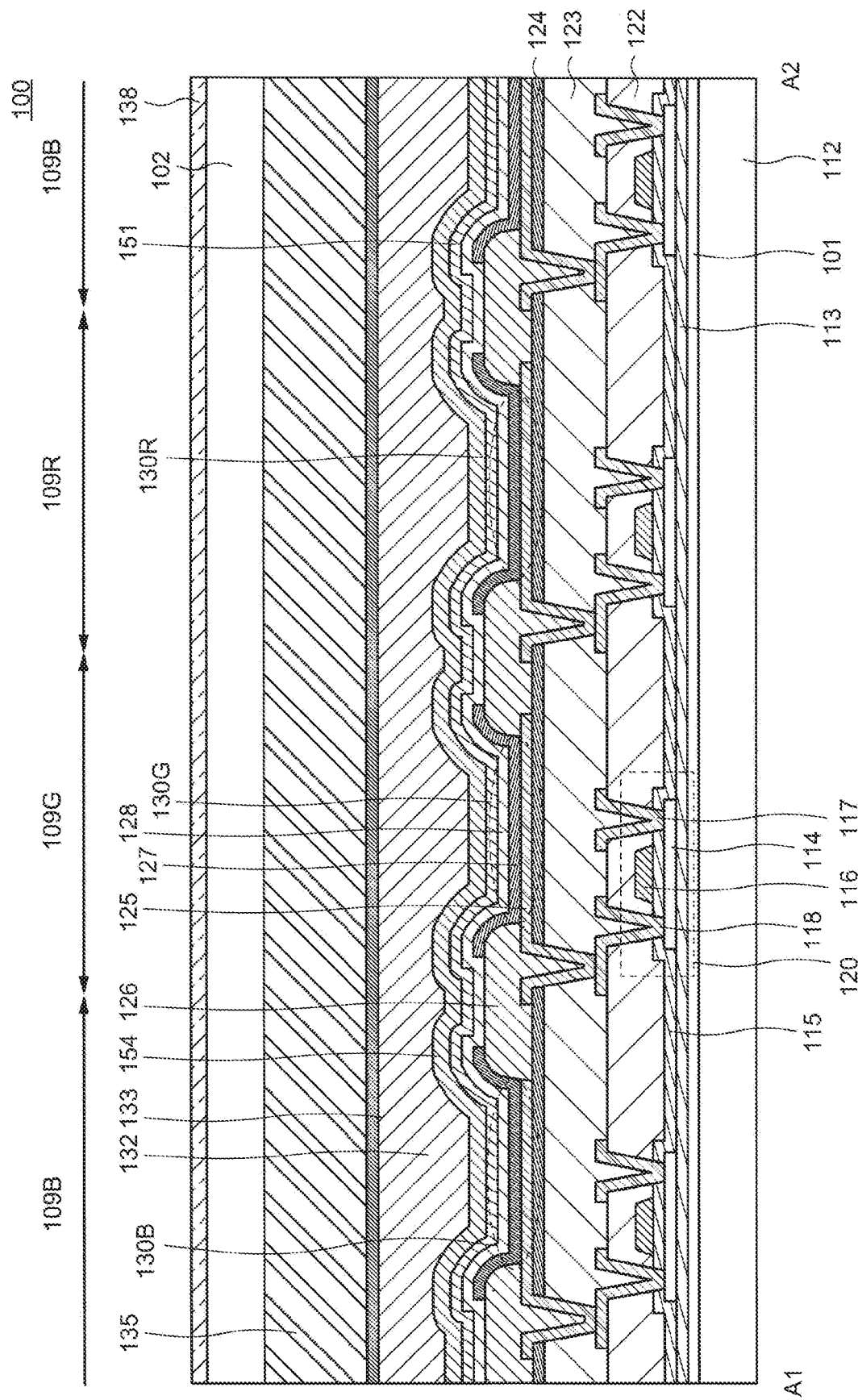
FIG. 32 is a schematic diagram of a cross part along the line A1-A2 of the display device shown in FIG. 1.

Next, as is shown in FIG. 32, the opposing substrate 102 is bonded onto the inorganic insulating layer 133 by an adhesive layer 135. For example, an acrylic adhesive material can be used as a material for forming the adhesive layer 135. In addition, the adhesive layer 135 may contain a water absorbing substance such as calcium or zeolite. By including a water absorbing substance in the adhesive layer 135, it is possible to delay the arrival of moisture to the light emitting element 130 even when moisture intrudes into the display device 100. In addition, a spacer may be arranged in the adhesive layer 135. By providing a spacer in the adhesive layer 135, it is possible to secure a gap between the first substrate 101 and the opposing substrate 102. Furthermore, the spacer may be mixed with the adhesive layer 135, or the spacer may be formed of a resin or the like above the first substrate 101. In addition, the same material as the materials exemplified for the first substrate 101 and the second substrate 112 can be used as a material for forming the opposing substrate 102.

For example, an overcoat layer which also functions as a flattener may be arranged for the opposing substrate 102. In addition, in the case where the organic layer emits white light, color filters corresponding to each color of RGB may be arranged on the main surface (surface facing the first substrate 101) on the opposing substrate 102. In addition, a black matrix may also be arranged between the color filters corresponding to each of the RGB colors. Furthermore, in the case when a color filter is not formed on the opposing substrate 102 side, for example, a color filter may be formed directly on the sealing film and the adhesive layer 135 may be formed thereon. In addition, a polarizing plate 138 is arranged on the rear surface (display surface side) of the opposing substrate 102

By using the manufacturing method explained above, it is possible to suppress mixed colors emitted by pixels other than a desired pixel and provide a display device which can also suppress a decrease in light emitting efficiency.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

An organic EL display device is mainly exemplified as a disclosure example in the present specification. In addition, each embodiment described above as an embodiment of the present invention can be applied from a medium to small size to a large size display device without any particular limitation.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:
1. A display device comprising:
a light emitting element including a first electrode, a light emitting layer and a plurality of organic layers includ- ing a hole transport layer above the first electrode, and a second electrode above the plurality of organic layers; and an insulation layer having an opening part exposing a part of the first electrode and covering a periphery side part of the first electrode, wherein when a hole mobility of the light emitting layer is $\mu_{h1}$ and a hole mobility of the hole transport layer is $\mu_{h2}$ then $$\frac{\mu_{h2}}{\mu_{h1}} \leq 10^3$$

when a periphery length of the part of the first electrode exposed by the opening part is L and an area of the first electrode exposed by the opening part is $S_0$ then $$\frac{L}{S_0} \geq 0.07,$$

the light emitting element includes a first light emitting element emitting red color, a second light emitting element emitting green color and a third light emitting element emitting blue color, and the $L/S_0$ in the first light emitting element, the $L/S_0$ in the second light emitting element and the $L/S_0$ in the third light emitting element are different respectively.

2. The display device according to claim 1, wherein a shape of the part of the first electrode exposed by the opening part is a substantially circular shape or a polygonal shape more than a hexagon, and an area of the part of the first electrode exposed by the opening part is 1000 µm² or more.

3. The display device according to claim 1, wherein the hole transport layer is commonly arranged in the first light emitting element, the second light emitting element, and the third light emitting element.

4. The display device according to claim 1, wherein the $L/S_0$ in the first light emitting element, the $L/S_0$ in the second light emitting element, and the $L/S_0$ in the third light emitting element are small in the order where the numeric value of the $\mu_{h2}/\mu_{h1}$ in the first light emitting element, the $\mu_{h2}/\mu_{h1}$ in the second light emitting element, and the $\mu_{h2}/\mu_{h1}$ in the third light emitting element is large.

5. The display device according to claim 1, wherein any of the light emitting layer and the hole transport layer includes an internal electrical field, and the orientation of the internal electrical field is a direction from a side in which electrons are injected to the light emitting layer towards a side in which holes are injected to the light emitting layer.

6. The display device according to claim 1, wherein any of the light emitting layer and the hole transport layer includes an internal electrical field, and the orientation of the internal electrical field is a direction from a side in which holes are injected to the light emitting layer towards a side in which electrons are injected to the light emitting layer.

7. The display device according to claim 1, wherein the $\mu_{h2}/\mu_{h1}$ in the first light emitting element, the $\mu_{h2}/\mu_{h1}$ in the second light emitting element, and the $\mu_{h2}/\mu_{h1}$ in the third light emitting element are different respectively.

8. The display device according to claim 7, wherein the first light emitting element has a $L/S_0$ determined with the $\mu_{h2}/\mu_{h1}$ in the second light emitting element as a reference, and the third light emitting element has a $L/S_0$ determined with the $\mu_{h2}/\mu_{h1}$ in the second light emitting element as a reference.

9. The display device according to claim 7, wherein the first light emitting element has a $L/S_0$ determined with a light emitting efficiency obtained by averaging a light emitting efficiency of the first light emitting element, a light emitting efficiency of the second light emitting element and a light emitting efficiency of the third light emitting element as a reference, the second light emitting element has a $L/S_0$ determined with the averaged light emitting efficiency as a reference, and the third light emitting element has a $L/S_0$ determined with the averaged light emitting efficiency as a reference.

* * * * *